United States Patent
Jachowski et al.

(10) Patent No.: US 12,255,625 B2
(45) Date of Patent: Mar. 18, 2025

(54) FILTER USING TRANSVERSELY-EXCITED FILM BULK ACOUSTIC RESONATORS WITH INDUCTIVELY COUPLED SUB-RESONATORS

(71) Applicant: Murata Manufacturing Co., Ltd., Nagaokakyo (JP)

(72) Inventors: Douglas Jachowski, Santa Cruz, CA (US); Ventsislav Yantchev, Sofia (BG); Bryant Garcia, Mississauga (CA); Patrick Turner, San Bruno, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 573 days.

(21) Appl. No.: 17/547,120

(22) Filed: Dec. 9, 2021

(65) Prior Publication Data

US 2022/0103160 A1     Mar. 31, 2022

Related U.S. Application Data

(63) Continuation-in-part of application No. 17/189,246, filed on Mar. 1, 2021, now Pat. No. 11,916,539.
(Continued)

(51) Int. Cl.
   *H03H 9/56*     (2006.01)
   *H03H 9/13*     (2006.01)
   *H03H 9/205*    (2006.01)

(52) U.S. Cl.
   CPC .............. *H03H 9/568* (2013.01); *H03H 9/13* (2013.01); *H03H 9/205* (2013.01)

(58) Field of Classification Search
   CPC .......... H03H 9/568; H03H 9/13; H03H 9/205; H03H 9/02559; H03H 9/0514; H03H 9/173; H03H 9/174; H03H 9/02228
(Continued)

(56) References Cited

U.S. PATENT DOCUMENTS 5,274,345 A     12/1993  Gau
5,446,330 A      8/1995  Eda et al.
(Continued)

FOREIGN PATENT DOCUMENTS

CN     106788318 A      5/2017
CN     110417373 A     11/2019
(Continued)

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
(Continued)

*Primary Examiner* — Jorge L Salazar, Jr.
(74) *Attorney, Agent, or Firm* — ArentFox Schiff LLP

(57) ABSTRACT

A filter includes first and second shunt resonators, at least one series resonator connected to the first and second shunt resonators in a ladder filter circuit, and a first ground contact pad. The first shunt resonator has two or more first sub-resonators and the second shunt resonator has two or more second sub-resonators. At least one first sub-resonator and at least one, but less than all, of the two or more second sub-resonators are connected to the first ground contact pad.

16 Claims, 15 Drawing Sheets

Related U.S. Application Data

(60) Provisional application No. 62/983,403, filed on Feb. 28, 2020.

(58) Field of Classification Search
USPC .......................... 333/133, 186–188, 193–196
See application file for complete search history.

(56) References Cited

U.S. PATENT DOCUMENTS

| | | |
|---|---|---|
| 5,552,655 A | 9/1996 | Stokes et al. |
| 5,631,515 A | 5/1997 | Mineyoshi et al. |
| 5,726,610 A | 3/1998 | Allen et al. |
| 5,853,601 A | 12/1998 | Krishaswamy |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,670,866 B2 | 12/2003 | Ella et al. |
| 6,707,229 B1 | 3/2004 | Martin |
| 6,710,514 B2 | 3/2004 | Ikada et al. |
| 6,833,774 B2 | 12/2004 | Abbott et al. |
| 6,914,477 B2 | 7/2005 | Shibahara |
| 7,345,400 B2 | 3/2008 | Nakao et al. |
| 7,463,118 B2 | 12/2008 | Jacobsen |
| 7,535,152 B2 | 5/2009 | Ogami et al. |
| 7,554,427 B2 | 6/2009 | Matsumoto |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,154,111 B2 | 10/2015 | Bradley |
| 9,219,466 B2 | 12/2015 | Meltaus et al. |
| 9,240,768 B2 | 1/2016 | Nishihara et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,389,391 B2 | 8/2019 | Ito |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,819,319 B1 | 10/2020 | Hyde |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,114,996 B2 | 9/2021 | Plesski et al. |
| 11,114,998 B2 | 9/2021 | Garcia et al. |
| 11,139,794 B2 | 10/2021 | Plesski et al. |
| 11,143,561 B2 | 10/2021 | Plesski |
| 11,146,231 B2 | 10/2021 | Plesski |
| 11,146,232 B2 | 10/2021 | Yandrapalli et al. |
| 11,146,238 B2 | 10/2021 | Hammond et al. |
| 11,146,244 B2 | 10/2021 | Yantchev |
| 11,165,407 B2 | 11/2021 | Yantchev |
| 11,171,629 B2 | 11/2021 | Turner |
| 11,323,089 B2 | 5/2022 | Turner |
| 11,368,139 B2 | 6/2022 | Garcia |
| 2002/0079986 A1 | 6/2002 | Ruby et al. |
| 2002/0130736 A1 | 9/2002 | Mukai |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0207033 A1 | 10/2004 | Koshido |
| 2004/0207485 A1 | 10/2004 | Kawachi et al. |
| 2004/0261250 A1 | 12/2004 | Kadota et al. |
| 2005/0099091 A1 | 5/2005 | Mishima |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0131731 A1 | 6/2006 | Sato |
| 2006/0152107 A1 | 7/2006 | Tanaka |
| 2006/0179642 A1 | 8/2006 | Kawamura |
| 2007/0090898 A1 | 4/2007 | Kando et al. |
| 2007/0115079 A1 | 5/2007 | Kubo et al. |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2007/0278898 A1 | 12/2007 | Miura et al. |
| 2008/0018414 A1 | 1/2008 | Inoue et al. |
| 2008/0246559 A1 | 10/2008 | Ayazi |
| 2008/0297280 A1 | 12/2008 | Thalhammer |
| 2009/0273415 A1 | 11/2009 | Frank |
| 2009/0315640 A1 | 12/2009 | Umeda |
| 2010/0019866 A1 | 1/2010 | Hara et al. |
| 2010/0026417 A1 | 2/2010 | Kubat |
| 2010/0064492 A1 | 3/2010 | Tanaka |
| 2010/0123367 A1 | 5/2010 | Tai et al. |
| 2010/0188166 A1* | 7/2010 | Hara .................... H03H 9/605 333/133 |
| 2010/0223999 A1 | 9/2010 | Onoe |
| 2010/0301703 A1 | 12/2010 | Chen et al. |
| 2011/0018389 A1 | 1/2011 | Fukano et al. |
| 2011/0018654 A1 | 1/2011 | Bradley et al. |
| 2011/0102107 A1 | 5/2011 | Onzuka |
| 2011/0109196 A1 | 5/2011 | Goto et al. |
| 2011/0278993 A1 | 11/2011 | Iwamoto |
| 2012/0286900 A1 | 11/2012 | Kadota et al. |
| 2012/0326809 A1 | 12/2012 | Tsuda |
| 2013/0057360 A1 | 3/2013 | Meltaus et al. |
| 2013/0127551 A1 | 5/2013 | Yamanaka |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1 | 1/2014 | Takahashi et al. |
| 2014/0009247 A1 | 1/2014 | Moriya |
| 2014/0113571 A1 | 4/2014 | Fujiwara et al. |
| 2014/0130319 A1 | 5/2014 | Iwamoto |

(56) References Cited

U.S. PATENT DOCUMENTS

| | | |
|---|---|---|
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2014/0312994 A1 | 10/2014 | Meltaus et al. |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0049920 A1 | 2/2016 | Kishino |
| 2016/0087187 A1 | 3/2016 | Burak |
| 2016/0182009 A1 | 6/2016 | Bhattacharjee |
| 2016/0285430 A1 | 9/2016 | Kikuchi et al. |
| 2016/0301382 A1 | 10/2016 | Iwamoto |
| 2017/0063332 A1 | 3/2017 | Gilbert et al. |
| 2017/0104470 A1 | 4/2017 | Koelle et al. |
| 2017/0179225 A1 | 6/2017 | Kishimoto |
| 2017/0179928 A1 | 6/2017 | Raihn et al. |
| 2017/0187352 A1 | 6/2017 | Omura |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0264266 A1 | 9/2017 | Kishimoto |
| 2017/0290160 A1 | 10/2017 | Takano et al. |
| 2017/0370791 A1 | 12/2017 | Nakamura et al. |
| 2018/0005950 A1 | 1/2018 | Watanabe |
| 2018/0013405 A1 | 1/2018 | Takata |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0278227 A1 | 9/2018 | Hurwitz |
| 2019/0007022 A1 | 1/2019 | Goto et al. |
| 2019/0068155 A1 | 2/2019 | Kimura |
| 2019/0068164 A1 | 2/2019 | Houlden et al. |
| 2019/0123721 A1 | 4/2019 | Takamine |
| 2019/0131953 A1 | 5/2019 | Gong |
| 2019/0148621 A1 | 5/2019 | Feldman et al. |
| 2019/0181825 A1 | 6/2019 | Schmalzl et al. |
| 2019/0181833 A1 | 6/2019 | Nosaka |
| 2019/0207583 A1 | 7/2019 | Miura et al. |
| 2019/0245518 A1 | 8/2019 | Ito |
| 2019/0273480 A1 | 9/2019 | Lin et al. |
| 2019/0305746 A1 | 10/2019 | Ota |
| 2019/0348966 A1 | 11/2019 | Campanella-Pineda |
| 2019/0379351 A1 | 12/2019 | Miyamoto et al. |
| 2019/0386633 A1 | 12/2019 | Plesski |
| 2019/0386635 A1 | 12/2019 | Plesski et al. |
| 2019/0386636 A1 | 12/2019 | Plesski et al. |
| 2019/0386638 A1 | 12/2019 | Kimura et al. |
| 2020/0007110 A1 | 1/2020 | Konaka et al. |
| 2020/0021271 A1 | 1/2020 | Plesski |
| 2020/0021272 A1 | 1/2020 | Segovia Fernandez et al. |
| 2020/0036357 A1 | 1/2020 | Mimura |
| 2020/0228087 A1 | 7/2020 | Michigami et al. |
| 2020/0235719 A1 | 7/2020 | Yantchev et al. |
| 2020/0259480 A1 | 8/2020 | Pensala |
| 2020/0313645 A1 | 10/2020 | Caron |
| 2020/0350891 A1 | 11/2020 | Turner |
| 2021/0013859 A1 | 1/2021 | Turner et al. |
| 2021/0273631 A1 | 9/2021 | Jachowski et al. |
| 2021/0328574 A1 | 10/2021 | Garcia |
| 2022/0103160 A1 | 3/2022 | Jachowski et al. |
| 2022/0149808 A1 | 5/2022 | Dyer et al. |
| 2022/0200567 A1 | 6/2022 | Garcia |

FOREIGN PATENT DOCUMENTS

| | | |
|---|---|---|
| CN | 210431367 U | 4/2020 |
| JP | H10209804 A | 8/1998 |
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2007329584 A | 12/2007 |
| JP | 2010062816 A | 3/2010 |
| JP | 2010233210 A | 10/2010 |
| JP | 2013528996 A | 7/2013 |
| JP | 2015054986 A | 3/2015 |
| JP | 2016001923 A | 1/2016 |
| JP | 2018166259 A | 10/2018 |
| JP | 2018207144 A | 12/2018 |
| JP | 2020113939 A | 7/2020 |
| WO | 2015098694 A1 | 7/2015 |
| WO | 2016017104 | 2/2016 |
| WO | 2016052129 A1 | 4/2016 |
| WO | 2016147687 A1 | 9/2016 |
| WO | 2018003268 A1 | 1/2018 |
| WO | 2018003273 | 1/2018 |
| WO | 2018163860 A1 | 9/2018 |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Buchanan "Ceramic Materials for Electronics" 3rd Edition, first published in 2004 by Marcel Dekker, Inc. pp. 496 (Year 2004). Jan. 00, 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Kadota et al. "5.4 Ghz Lamb Wave Resonator on LiNbO3 Thin Crystal Plate and its Application," published in Japanese Journal of Applied Physics 50 (2011) 07HD11. (Year: 2011) 2011.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Material Properties of Tibtech Innovations, © 2018 TIBTECH Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. 1, 69, No. 4 (1986): 47-55. doi:10.1002/ecja.4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

(56) References Cited

OTHER PUBLICATIONS

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.
Safari et al. "Piezoelectric for Transducer Applications" published by Elsevier Science Ltd., pp. 4 (Year: 2000). 2020.
Santosh, G., Surface acoustic wave devices on silicon using patterned and thin film ZnO, Ph.D. thesis, Feb. 2016, Indian Institute of technology Guwahati, Assam, India Feb. 2016.
Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 00, 2015.
T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
USPTO/ISA, International Search Report and Written Opinion for PCT Application No. PCT/US2020/45654 dated Oct. 29, 2020.
USPTO/ISA, International Search Report and Written Opinion for PCT Application No. PCT/US2021/024824 dated Jul. 27, 2021, 9 total pages.
USPTO/ISA, International Search Report and Written Opinion for PCT Application No. PCT/US2021/048505 dated Dec. 1, 2021, 11 total pages.
Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
Zou, Jie "High-Performance Aluminum Nitride Lamb Wave Resonators for RF Front-End Technology" University of California, Berkeley, Summer 2015, pp. 63 (Year 2015) Jan. 00, 2015.
Gorisse et al., "Lateral Field Excitation of membrane-based Aluminum Nitride resonators," Joint Conference of the IEEE International Frequency Control and the European Frequency and Time Forum (FCS), May 2011, 5 pages.
Pang et al., "Self-Aligned Lateral Field Excitation Film Acoustic Resonator with Very Large Electromechanical Coupling," IEEE International Ultrasonics, Ferroelectrics, and Frequency Control Joint 50th Anniversary Conference, Aug. 2004, pp. 558-561.
Yandrapalli et al., "Toward Band n78 Shear Bulk Acoustic Resonators Using Crystalline Y-Cut Lithium Niobate Films With Spurious Suppression," Journal of Microelectromechanical System, Aug. 2023, vol. 32, No. 4, pp. 327-334.
Xue et al., High Q Lateral-Field-Excited Bulk Resonator Based on Single-Crystal LiTaO3 for 5G Wireless Communication, Journal of Electron Devices Society, Mar. 2021, vol. 9, pp. 353-358.
International Search Report and Written Opinion in PCT/US2022/081068, mailed Apr. 18, 2023, 17 pages.
Office Action in JP2021175220, mailed Apr. 25, 2023, 10 pages.

\* cited by examiner

| Resonator | Pitch* (μm) | p/td* | Mark* (μm) | m/p* | tfsd (nm) |
|---|---|---|---|---|---|
| SE1A/B/C/D | 5.56 | 12.2 | 1.24 | 0.22 | 60 |
| SE2A/B/C/D | 5.47 | 12.0 | 1.32 | 0.24 | 60 |
| SE3A/B/C/D | 5.57 | 12.2 | 1.30 | 0.23 | 60 |
| SE4A/B/C | 5.54 | 12.2 | 1.26 | 0.23 | 20 |
| SH1A/B | 5.24 | 6.0 | 1.46 | 0.28 | 20 |
| SH2A/B/C | 5.15 | 8.6 | 1.51 | 0.26 | 20 |
| SH3A/B/C | 5.06 | 8.8 | 1.37 | 0.27 | 20 |
| SH4A/B/C/D | 5.05 | 8.7 | 1.48 | 0.26 | 20 | td (series resonators) = 455 nm, td (shunt resonators) = 580 nm
* Average of all sub-resonators

FILTER USING TRANSVERSELY-EXCITED FILM BULK ACOUSTIC RESONATORS WITH INDUCTIVELY COUPLED SUB-RESONATORS

RELATED APPLICATION INFORMATION

This patent is a continuation-in-part of application Ser. No. 17/189,246, filed Mar. 1, 2021, titled SPLIT-LADDER BAND N77 FILTER USING TRANSVERSELY-EXCITED FILM BULK ACOUSTIC RESONATORS, which claims priority from provisional patent application 62/983,403, titled MULTIPLE PIEZOELECTRIC THICKNESS XBAR FILTERS, filed Feb. 28, 2020. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 uses the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) at least partially disposed on a thin floating layer, or diaphragm which is or includes a layer of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
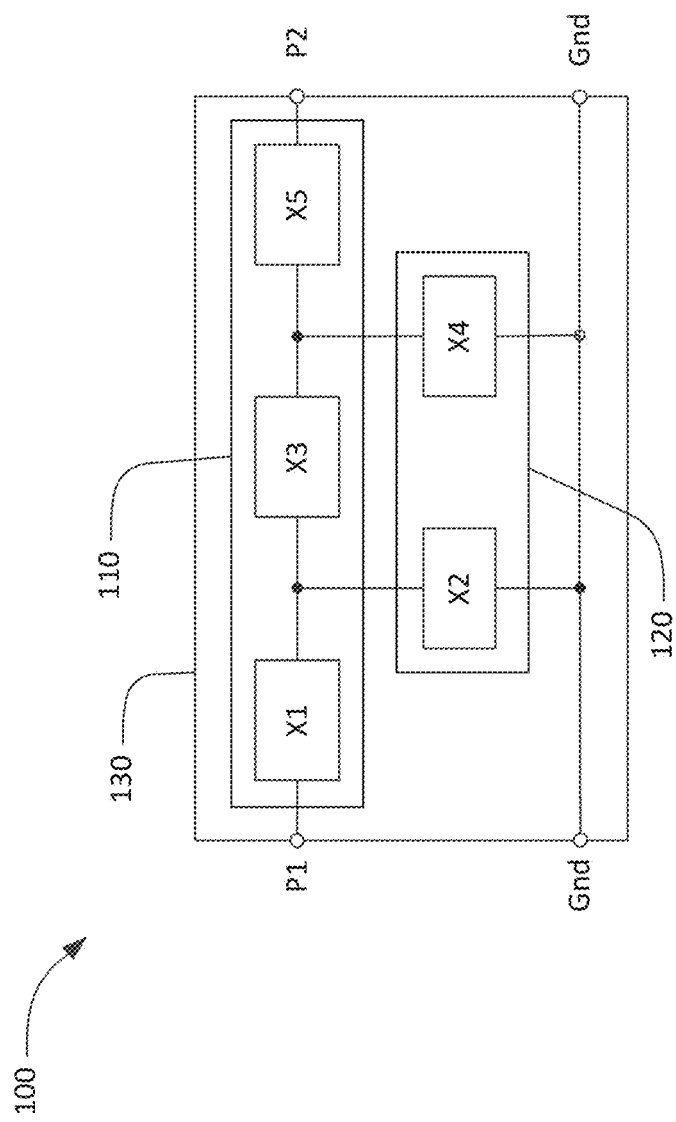
FIG. 1 is a schematic diagram of an exemplary split-ladder band-pass filter.

FIG. 1 is a schematic circuit diagram of an exemplary band-pass filter 100 using five XBARs X1-X5. The filter 100 may be, for example, a band N77 band-pass filter for use in a communication device. The filter 100 has a conventional ladder filter architecture including three series resonators X1, X3, X5 and two shunt resonators X2, X4. The three series resonators X1, X3, X5 are connected in series between a first port P1 and a second port P2. The filter 100 is bidirectional and either port may serve as the input or output of the filter. The two shunt resonators X2, X4 are connected from nodes between the series resonators to ground. All the shunt resonators and series resonators are XBARs.

Each of the resonators X1 to X5 has a resonance frequency and an anti-resonance frequency. In over-simplified terms, each resonator is effectively a short circuit at its resonance frequency and effectively an open circuit at its anti-resonance frequency. Each resonator X1 to X5 creates a "transmission zero", where the transmission between the in and out ports is very low. Note that the transmission at a "transmission zero" is not actually zero due to energy leakage through parasitic components and other effects. The three series resonators X1, X3, X5 create transmission zeros at their respective anti-resonance frequencies (where each resonator is effectively an open circuit). The two shunt resonators X2, X4 create transmission zeros at their respective resonance frequencies (where each resonator is effectively a short circuit). In a typical band-pass filter using acoustic resonators, resonance frequencies of the shunt resonators are positioned below the passband of the filter and the anti-resonance frequencies of the shunt resonators are within the passband. Resonance frequencies of the series resonators are within the passband and the anti-resonance frequencies of the series resonators are positioned above the passband.

The filter 100 uses a "split-ladder" architecture in which the series resonators X1, X3, X5 are fabricated on a first chip 110 and the shunt resonators X2, X4 are fabricated on a second chip 120. The first chip 110 and the second chip 120 are mounted on a circuit board 130 which provides interconnections between the first and second chips 110, 120. As will be described subsequently, the use of the split-ladder architecture allows the use of a different thickness of piezoelectric material for the series and shunt resonators.

Figure 2:
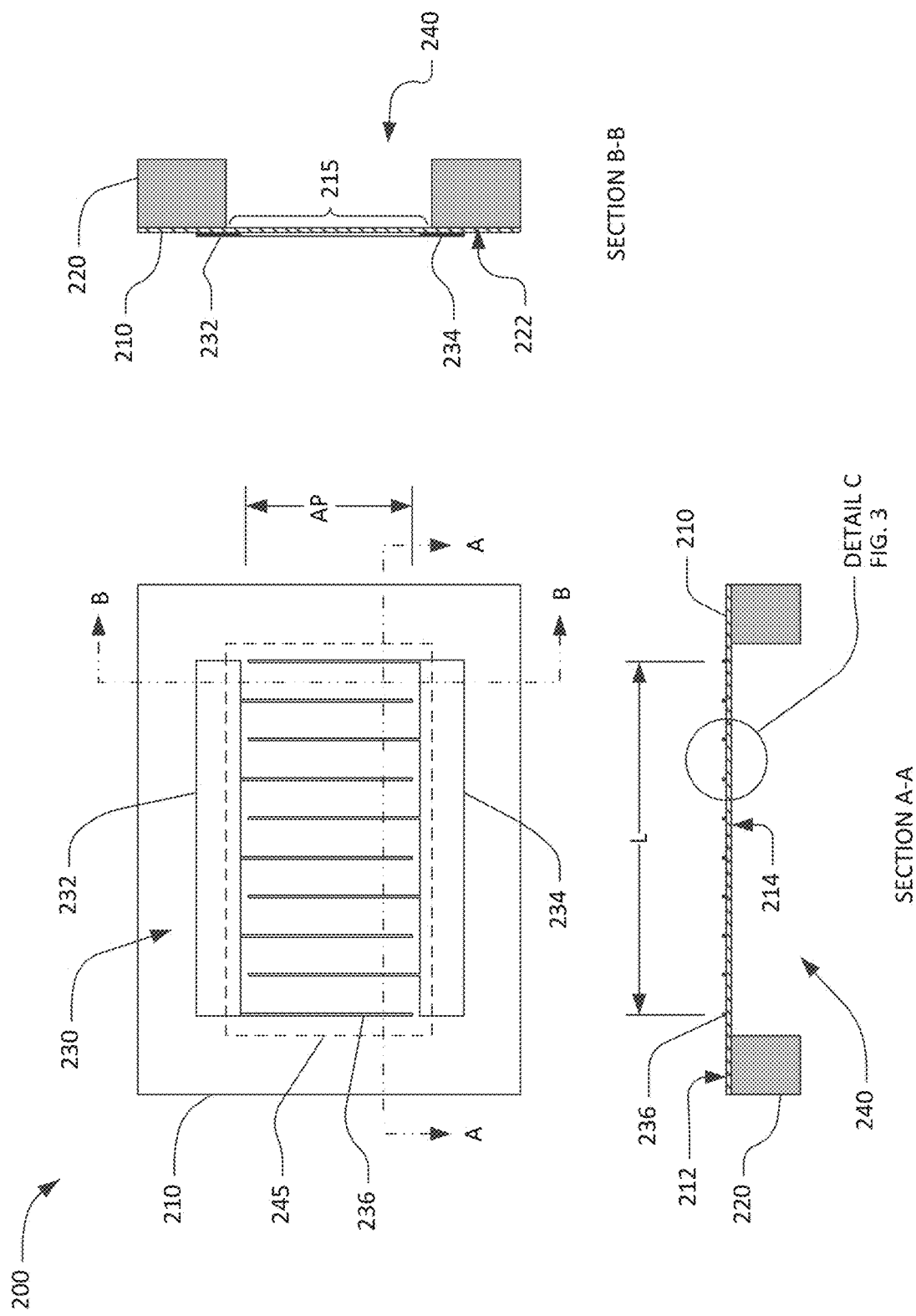
FIG. 2 has a schematic plan view and two schematic cross-sectional views of a transversely-excited film bulk acoustic resonator (XBAR).

Referring now to FIG. 2, the structure of XBARs will be described in further detail. FIG. 2 shows a simplified schematic top view and orthogonal cross-sectional views of a an XBAR 200. The XBAR 200 is made up of a thin film conductor pattern formed on a surface of a piezoelectric plate 210 having a front surface 212 and a back surface 214. The front and back surfaces are essentially parallel. "Essentially parallel" means parallel to the extent possible within normal manufacturing tolerances. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are rotated YX-cut. However, XBARs may be fabricated on piezoelectric plates with other crystallographic orientations including rotated Z-cut and rotated Z-cut.

The back surface 214 of the piezoelectric plate 210 is attached to a surface 222 of the substrate 220 except for a portion of the piezoelectric plate 210 that forms a diaphragm 215 spanning a cavity 240 formed in the substrate 220. The cavity 240 has a perimeter defined by the intersection of the cavity and the surface 222 of the substrate 220. The portion of the piezoelectric plate that spans the cavity is referred to herein as the "diaphragm" due to its physical resemblance to the diaphragm of a microphone. As shown in FIG. 2, the diaphragm 215 is contiguous with the rest of the piezoelectric plate 210 around all of the perimeter 245 of the cavity 240. In this context, "contiguous" means "continuously connected without any intervening item".

The substrate 220 provides mechanical support to the piezoelectric plate 210. The substrate 220 may be, for example, silicon, sapphire, quartz, or some other material or combination of materials. The back surface 214 of the piezoelectric plate 210 may be attached to the substrate 220 using a wafer bonding process. Alternatively, the piezoelectric plate 210 may be grown on the substrate 220 or otherwise attached to the substrate. The piezoelectric plate 210 may be attached directly to the substrate or may be attached to the substrate 220 via one or more intermediate material layers.

The cavity 240 is an empty space within a solid body of the resonator 200. The cavity 240 may be a hole completely through the substrate 220 (as shown in Section A-A and Section B-B) or a recess in the substrate 220 (not shown). The cavity 240 may be formed, for example, by selective etching of the substrate 220 before or after the piezoelectric plate 210 and the substrate 220 are attached.

The conductor pattern of the XBAR 200 includes an interdigital transducer (IDT) 230. An IDT is an electrode structure for converting between electrical and acoustic energy in piezoelectric devices. The IDT 230 includes a first plurality of parallel elongated conductors, commonly called "fingers", such as finger 236, extending from a first busbar 232. The IDT 230 includes a second plurality of fingers extending from a second busbar 234. The first and second pluralities of parallel fingers are interleaved. The interleaved fingers overlap for a distance AP, commonly referred to as the "aperture" of the IDT. The center-to-center distance L between the outermost fingers of the IDT 230 is the "length" of the IDT.

The term "busbar" refers to the conductors that interconnect the first and second sets of fingers in an IDT. As shown in FIG. 2, each busbar 232, 234 is an elongated rectangular conductor with a long axis orthogonal to the interleaved fingers and having a length approximately equal to the length L of the IDT. The busbars of an IDT need not be rectangular or orthogonal to the interleaved fingers and may have lengths longer than the length of the IDT.

The first and second busbars 232, 234 serve as the terminals of the XBAR 200. A radio frequency or microwave signal applied between the two busbars 232, 234 of the IDT 230 excites a primary acoustic mode within the piezoelectric plate 210. As will be discussed in further detail, the primary acoustic mode is a bulk shear mode where acoustic energy propagates along a direction substantially orthogonal to the surface of the piezoelectric plate 210, which is also normal, or transverse, to the direction of the electric field created by the IDT fingers. Thus, the XBAR is considered a transversely-excited film bulk wave resonator.

The IDT 230 is positioned on the piezoelectric plate 210 such that at least a substantial portion of the fingers of the IDT 230 are disposed on the diaphragm 215 of the piezoelectric plate that spans, or is suspended over, the cavity 240. As shown in FIG. 2, the cavity 240 has a rectangular shape with an extent greater than the aperture AP and length L of the IDT 230. A cavity of an XBAR may have a different shape, such as a regular or irregular polygon. The cavity of an XBAR may have more or fewer than four sides, which may be straight or curved.

For ease of presentation in FIG. 2, the geometric pitch and width of the IDT fingers is greatly exaggerated with respect to the length (dimension L) and aperture (dimension AP) of the XBAR. An XBAR for a 5G device will have more than ten parallel fingers in the IDT 210. An XBAR may have hundreds, possibly thousands, of parallel fingers in the IDT 210. Similarly, the thickness of the fingers in the cross-sectional views is greatly exaggerated in the drawings.

Figure 3:
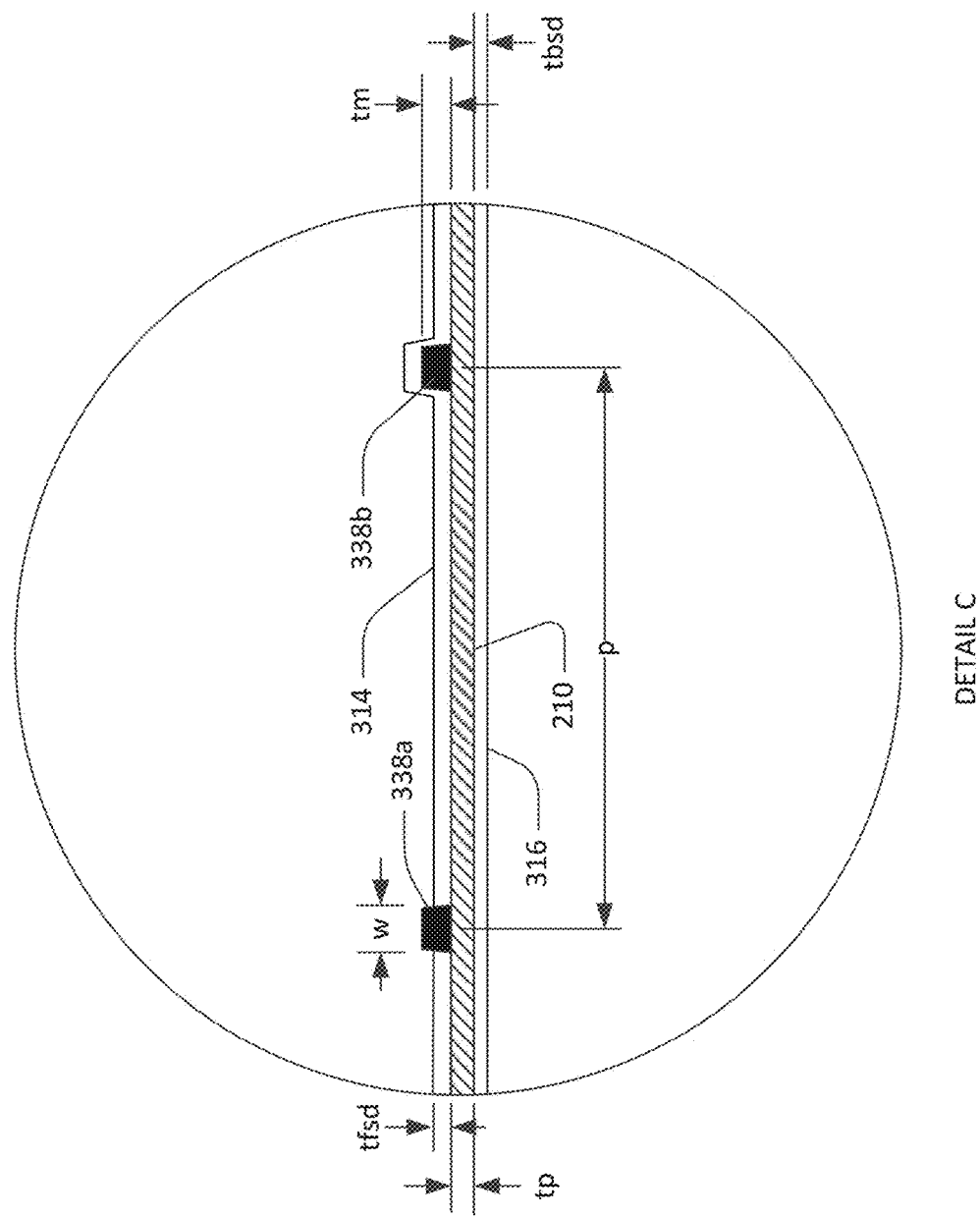
FIG. 3 is an expanded schematic cross-sectional view of a portion of the XBAR of FIG. 2.

FIG. 3 shows a detailed schematic cross-sectional view of the XBAR 200. The piezoelectric plate 210 is a single-crystal layer of piezoelectric material having a thickness ts. ts may be, for example, 100 nm to 1500 nm. When used in filters for 5G NR and WiFI bands from 3.3 GHZ to 7 GHz, the thickness ts may be, for example, 250 nm to 700 nm.

A front-side dielectric layer 314 may be formed on the front side of the piezoelectric plate 210. The "front side" of the XBAR is the surface facing away from the substrate. The front-side dielectric layer 314 has a thickness tfd. The front-side dielectric layer 314 may be formed only between the IDT fingers (see IDT finger 338a). The front side dielectric layer 314 may also be deposited over the IDT fingers (see IDT finger 338b). A back-side dielectric layer 316 may be formed on the back side of the piezoelectric plate 210. The back-side dielectric layer 316 has a thickness tbd. The front-side and back-side dielectric layers 314, 316 may be a non-piezoelectric dielectric material, such as silicon dioxide or silicon nitride. tfd and tbd may be, for example, 0 to 500 nm. tfd and tbd are each typically less than one-half of the thickness ts of the piezoelectric plate. tfd and tbd are not necessarily equal, and the front-side and back-side dielectric layers 314, 316 are not necessarily the same material. Either or both of the front-side and back-side dielectric layers 314, 316 may be formed of multiple layers of two or more materials.

The IDT fingers 338a, 338b may be one or more layers of aluminum, a substantially aluminum alloys, copper, a substantially copper alloys, beryllium, gold, molybdenum, or some other conductive material. Thin (relative to the total thickness of the conductors) layers of other metals, such as chromium or titanium, may be formed under and/or over the fingers to improve adhesion between the fingers and the piezoelectric plate 210 and/or to passivate or encapsulate the fingers. The busbars (232, 234 in FIG. 2) of the IDT may be made of the same or different materials as the fingers. As shown in FIG. 3, the IDT fingers 338a, 338b have rectangular or trapezoidal cross-sections. The IDT fingers may have some other cross-sectional shape.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness tp of the piezoelectric plate 210. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (232, 234 in FIG. 2) of the IDT may be the same as, or greater than, the thickness tm of the IDT fingers.

Figure 4:
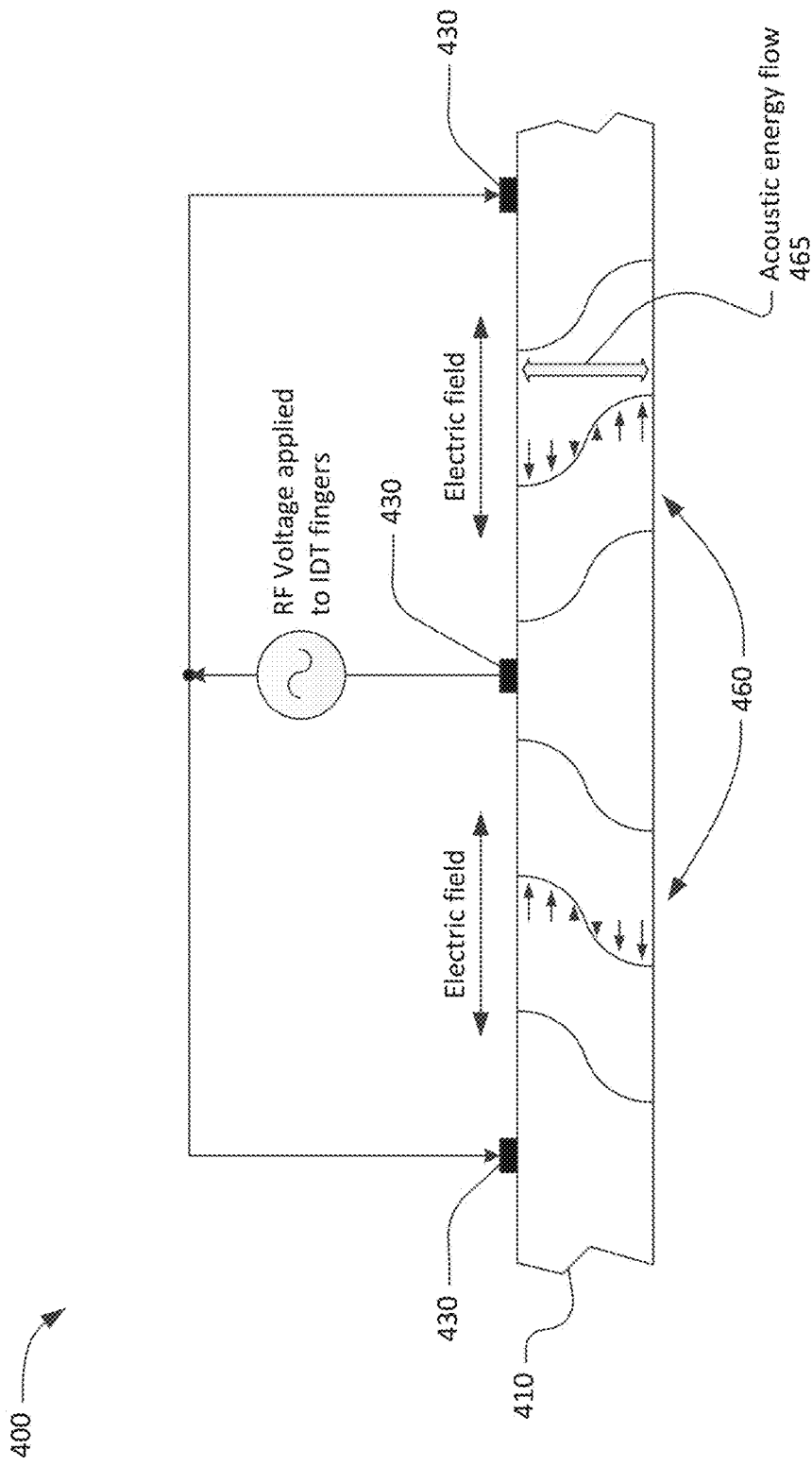
FIG. 4 is a graphic illustrating a shear primary acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. A radio frequency (RF) voltage is applied to the interleaved fingers 430. This voltage creates a time-varying electric field between the fingers. The direction of the electric field is primarily lateral, or parallel to the surface of the piezoelectric plate 410, as indicated by the arrows labeled "electric field". Since the dielectric constant of the piezoelectric plate is significantly higher than the surrounding air, the electric field is highly concentrated in the plate relative to the air. The lateral electric field introduces shear deformation, and thus strongly excites a shear-mode acoustic mode, in the piezoelectric plate 410. Shear deformation is deformation in which parallel planes in a material remain parallel and maintain a constant distance while translating relative to each other. A "shear acoustic mode" is an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

The resonance frequency of an XBAR is determined by the thickness of the diaphragm and the pitch and mark (width) of the IDT fingers. The thickness of the diaphragm, which includes the thickness of the piezoelectric plate and the thicknesses of front-side and/or back-side dielectric layers, is the dominant factor determining the resonance frequency. The tuning range provided by varying the pitch and/or mark is limited to only a few percent. For broad bandwidth filters such as band N77 and band N79 band-pass filters, the tuning range provided by varying the pitch is insufficient to provide the necessary separation between the resonance frequencies of the shunt and the anti-resonance frequencies of the series resonators.

U.S. Pat. No. 10,491,192 describes the use of a front-side dielectric frequency setting layer formed only over shunt resonators to extend the bandwidth capability of XBAR filters. The dielectric frequency setting layer increases the thickness of the diaphragms of the shunt resonators and thus reduces the resonance frequency of the shunt resonators relative to the series resonators. However, there is a practical limit to the thickness of a frequency setting layer because a thick dielectric layer fosters additional spurious modes that may degrade filter performance.

Figure 5:
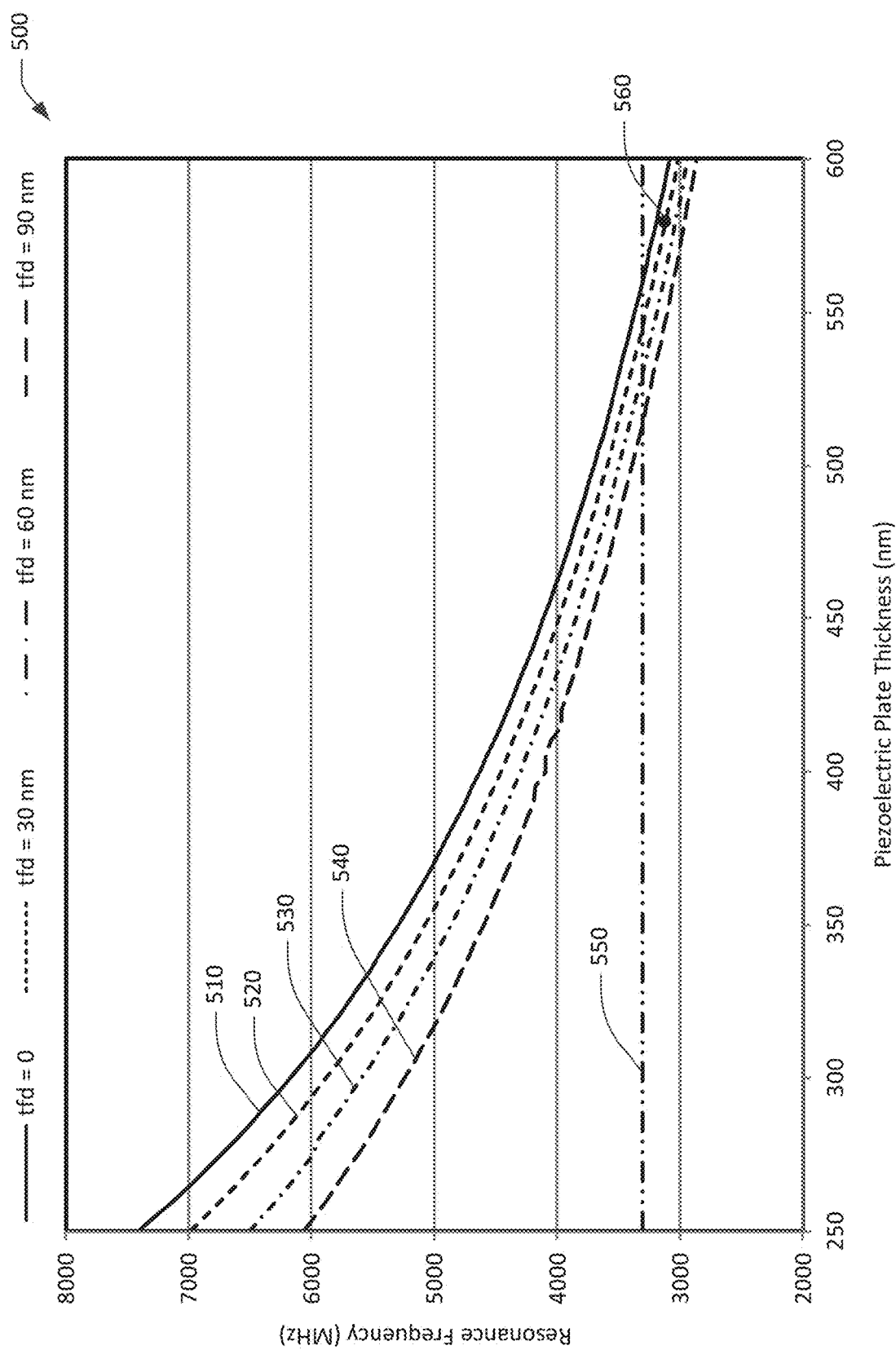
FIG. 5 is a graph of the resonance frequency of an XBAR as a function of piezoelectric plate thickness for four different dielectric thicknesses.

FIG. 5 is graph 500 of the relationship between the resonance frequency, piezoelectric plate thickness, and topside dielectric thickness for representative XBARs using lithium niobate piezoelectric plates with Euler angles of [0°, β, 0°], where 0°<β≤60°, as described in U.S. Pat. No. 10,790,802. For historical reasons, such plates are commonly referred to as "rotated YX-cut" where the "rotation angle" is β+90°. Band N77 filters may preferably use 1200 to 1280 degree rotated YX-cut piezoelectric plates, which is to say plates with Euler angles [0°, 30° to 38°, 0°].

The solid line 510 is a plot of the dependence of resonance frequency on piezoelectric plate thickness without a front-side dielectric layer. The short-dash line 520 is a plot of the dependence of resonance frequency on piezoelectric plate thickness with a front-side dielectric layer thickness of 30 nm. The dot-dash line 530 is a plot of the dependence of resonance frequency on piezoelectric plate thickness with a front-side dielectric layer thickness of 60 nm. The long-dash line 540 is a plot of the dependence of resonance frequency on piezoelectric plate thickness with a front-side dielectric layer thickness of 90 nm. In all cases, the piezoelectric plate is 128-degree YX-cut lithium niobate, the IDT pitch is 10 times the piezoelectric plate thickness, the mark/pitch ratio is 0.25, and the IDT electrodes are aluminum with a thickness of 1.25 times the piezoelectric plate thickness. The dielectric layers are $SiO_2$. There is no back-side dielectric layer.

The dash-dot-dot line 550 marks the lower edge of band N77 at 3300 MHz. From FIG. 5, one can see that a resonance frequency of 3300 MHz can be obtained by different combinations of piezoelectric plate thickness and dielectric thickness. For example, with no dielectric layer, a piezoelectric plate thickness of 561 nm results in a resonance frequency of 3300 MHz. Alternatively, a piezoelectric plate thickness of 516 nm with a 90 nm dielectric layer also provides a resonance frequency of 3300 MHz.

As previously described, in a ladder filter circuit, shunt resonators provide transmission zeros at frequencies below the lower edge of the filter passband. To this end, the resonance frequencies of the shunt resonators of a band N77 filter must be less than 3300 MHz. Exactly how much less than 3300 MHz depends on the filter specifications, the Q-factors of the shunt resonators, and allowances for manufacturing tolerances and temperature variations. The filled circle 560 represents XBARs using 580 nm piezoelectric plate thickness with a 20 nm front-side dielectric layer, as used in an exemplary filter to be described subsequently.

From FIG. 5 it can also be seen that 90 mm layer of $SiO_2$ has the same effect on resonance frequency as roughly a 45 nm (561 nm-516 nm) change in the thickness of the lithium niobate piezoelectric plate. The thicknesses of the lithium niobate piezoelectric plate and the front-side $SiO_2$ layer can be combined to provide an equivalent thickness of the XBAR diaphragm as follows:

$$teqr=tp+kr(tfsd) \qquad (1)$$

where teqr is the "LN-equivalent" thickness (i.e. the thickness of lithium niobate having the same resonance frequency) of the diaphragm for shunt resonators. tp and tfsd are the thickness of the piezoelectric plate and front-side dielectric layer as previously defined, and kr is proportionally constant for shunt resonators. kr depends on the material of the front-side dielectric layer. When the front-side dielectric layer is $SiO_2$, kr is approximately 0.59.

Figure 6:
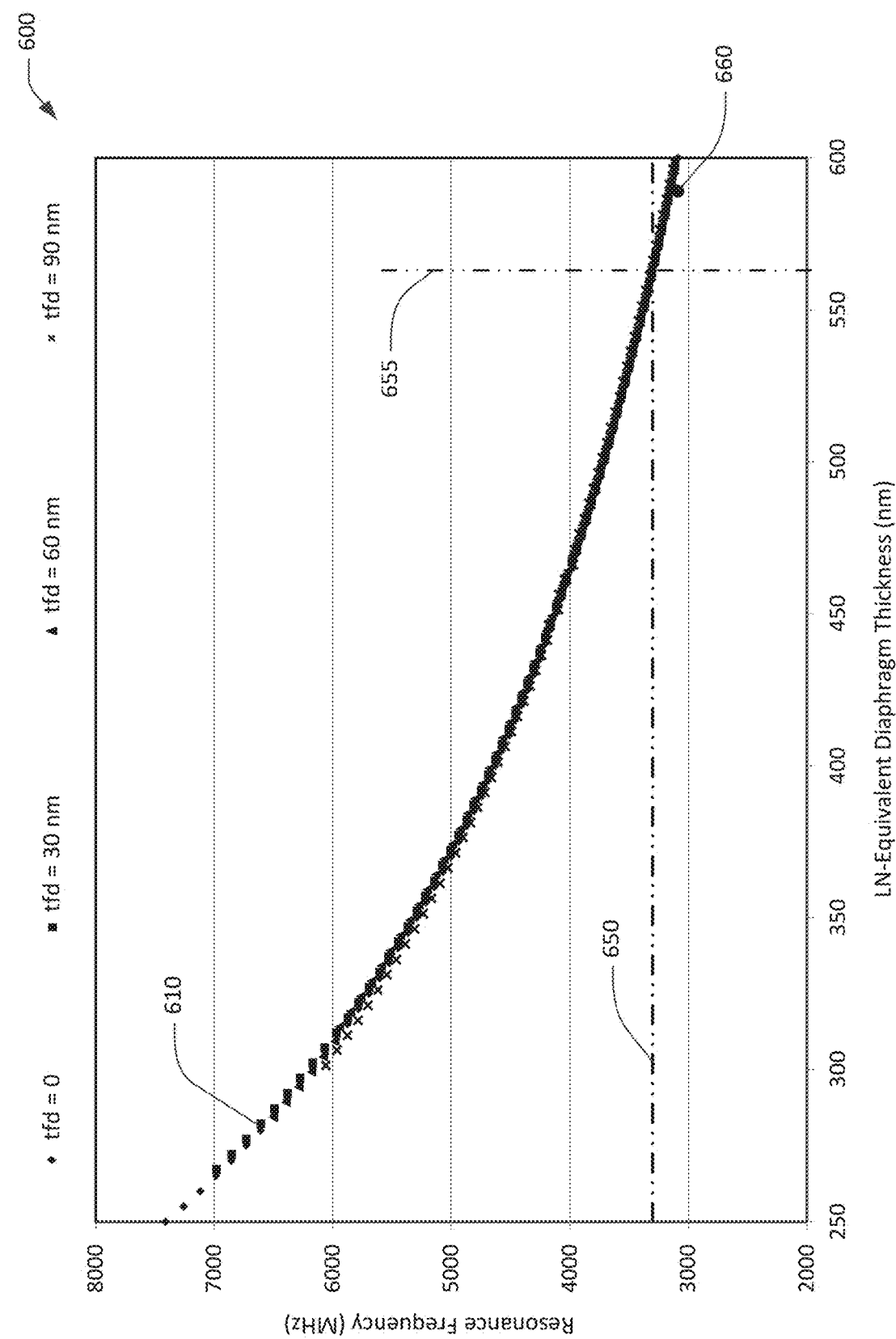
FIG. 6 is a graph of the resonance frequency of an XBAR as a function of equivalent diaphragm thickness for four different dielectric thicknesses.

FIG. 6 is a graph 600 of the dependence of resonance frequency on LN-equivalent diaphragm thickness. The data shown in FIG. 6 is the same as the data shown in FIG. 5, with LN-equivalent thickness calculated using formula (1) with k=0.59. The composite line 610 is made up of the resonance frequency data points for four different dielectric (oxide) thicknesses. These data points form a reasonably continuous curve.

The data in FIG. 6 is specific to XBARs with the IDT pitch equal to 10 times the piezoelectric plate thickness, a preferred range of the pitch of an XBAR is 6 to 12.5 times the IDT pitch (see U.S. Pat. No. 10,637,438). Electromechanical coupling decreases sharply for pitch less than 6 time the piezoelectric plate thickness, reducing the difference between the resonance and anti-resonance frequencies. Increasing the pitch above 12.5 times the piezoelectric plate thickness reduces capacitance per unit resonator area with little benefit in terms of electromechanical coupling or frequency change.

Reducing the pitch to 6 times the piezoelectric plate thickness increases resonance frequency by about 4.5% compared to an XBAR with pitch equal to 10 times the piezoelectric plate thickness. Increasing the pitch to 12.5 times the piezoelectric plate thickness reduces resonance frequency by about 1.1% compared to an XBAR with pitch equal to 10 times the piezoelectric plate thickness. Conversely, an XBAR with pitch equal to 6 times the piezoelectric plate thickness will need a 4.5% thicker diaphragm to have the same resonance frequency as an XBAR with pitch equal to 10 times the piezoelectric plate thickness. An XBAR with pitch equal to 12.5 times the piezoelectric plate thickness will need a 1.1% thinner diaphragm to have the same resonance frequency as an XBAR with pitch equal to 10 times the piezoelectric plate thickness.

The dash-dot-dot horizontal line 650 marks the lower edge of band N77 at 3300 MHz. The dash-dot vertical line 655 marks an LN-equivalent thickness of 563 nm, which is the thickness that provides a resonance frequency of 3300 MHz. The LN-equivalent plate thickness would be reduced to about 556 nm if the pitch is increased to 12.5 time the piezoelectric plate thickness. In a band N77 filter using a ladder filter circuit, the diaphragms of all of the shunt resonators will have LN-equivalent thicknesses of greater than 556 nm. Typically, at least one shunt resonator will have a LN-equivalent diaphragm thickness of 565 nm to 600 nm to provide a transmission zero a at resonance frequency 50 MHz to 200 MHz less than the lower band edge (i.e. at 3100 MHZ to 3250 MHz).

The LN-equivalent thickness of the diaphragm of the shunt resonators need not be the same. One or more additional dielectric layer may be formed over a subset of the shunt resonators to lower their resonance frequencies (for example to increase attenuation in a stop band below the lower band edge). While there is no absolute upper limit on the thickness of a front-side dielectric layer, XBARs with tfsd/tp>0.30 tend to have substantial spurious modes. Thus a practical upper limit on LN-equivalent diaphragm thickness is about (1+0.3×0.59)(556 nm)=655 nm.

Figure 7:
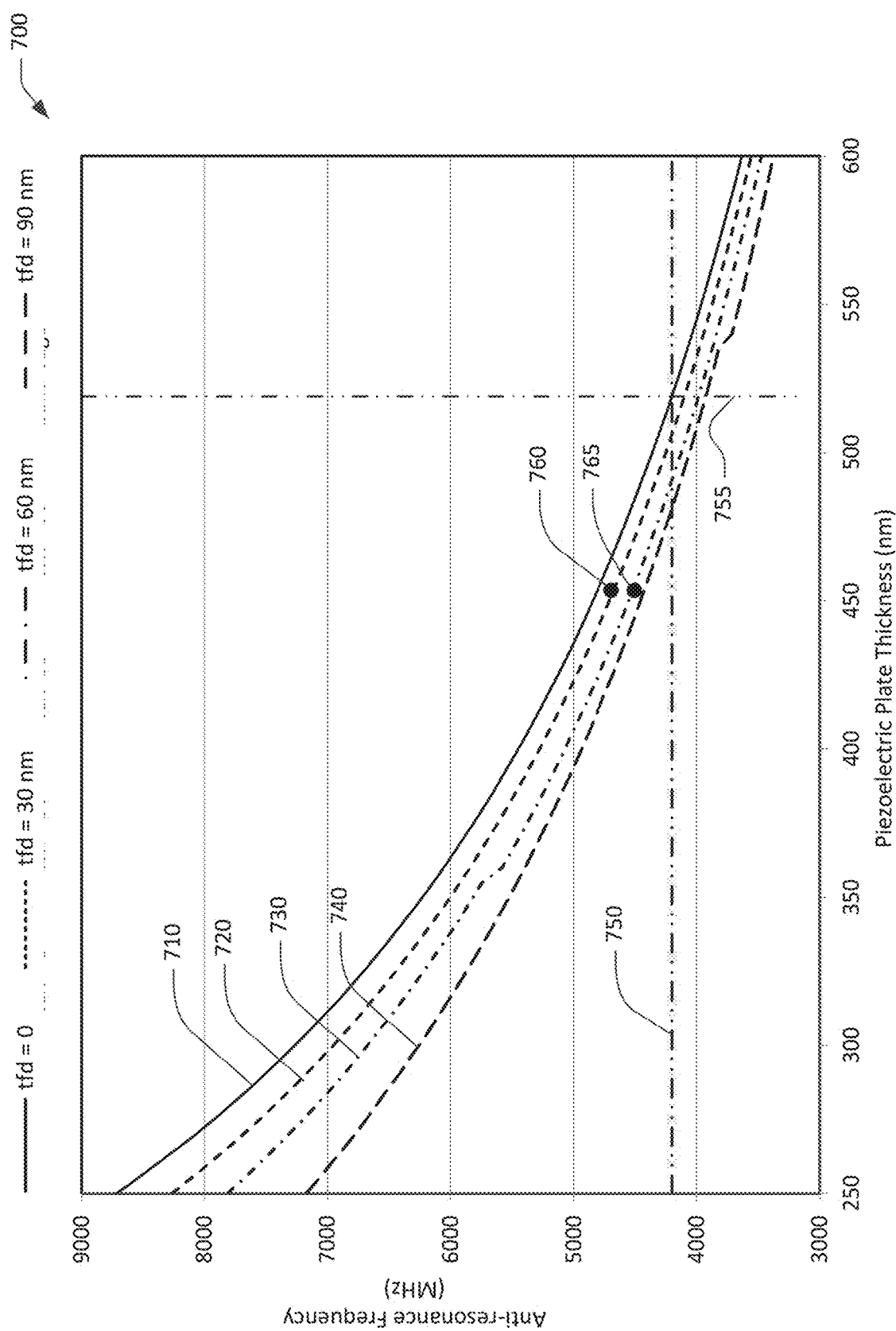
FIG. 7 is a graph of the anti-resonance frequency of an XBAR as a function of piezoelectric plate thickness for four different dielectric thicknesses.

FIG. 7 is a graph 700 of the relationship between the anti-resonance frequency, piezoelectric plate thickness, and top-side dielectric thickness for representative XBARs. The solid line 710 is a plot of the dependence of anti-resonance frequency on piezoelectric plate thickness without a front-side dielectric layer. The short-dash line 720 is a plot of the dependence of anti-resonance frequency on piezoelectric plate thickness with a front-side dielectric layer thickness of 30 nm. The dot-dash line 730 is a plot of the dependence of anti-resonance frequency on piezoelectric plate thickness with a front-side dielectric layer thickness of 60 nm. The long-dash line 740 is a plot of the dependence of anti-resonance frequency on piezoelectric plate thickness with a front-side dielectric layer thickness of 90 nm. In all cases, the piezoelectric plate is 128-degree YX-cut lithium niobate, the IDT pitch is 10 times the piezoelectric plate thickness, the mark/pitch ratio is 0.25, and the IDT electrodes are aluminum with a thickness of 1.25 times the piezoelectric plate thickness. The dielectric layers are $SiO_2$. There is no back-side dielectric layer.

The dash-dot-dot line 750 marks the upper edge of band N77 at 4200 MHz. From FIG. 7, one can see that an anti-resonance frequency of 4200 MHz can be obtained by different combinations of piezoelectric plate thickness and dielectric thickness. For example, with no dielectric layer, a piezoelectric plate thickness of 518 nm results in an anti-resonance frequency of 4200 MHz. Alternatively, a piezoelectric plate thickness of 480 nm with a 90 nm dielectric layer also provides an anti-resonance frequency of 4200 MHz.

As previously described, in a ladder filter circuit, series resonators provide transmission zeros at frequencies above the upper edge of the filter passband. To this end, the anti-resonance frequencies of the series resonators of a band N77 filter must be greater than 4200 MHz. Exactly how much greater than 4200 MHz depends on the filter specifications, the Q-factors of the series resonators, and allowances for manufacturing tolerances and temperature variations including temperature increases due to power consumed in the filter during transmission. The filled circles 760, 765 represent XBARs using 455 nm piezoelectric plate thickness with a 20 nm and 60 nm, respectively, front-side dielectric layers, as used in the exemplary filter to be described subsequently.

From FIG. 7 it can also be seen that a 90 mm layer of $SiO_2$ has the same effect on resonance frequency as roughly a 38 nm (518 nm-480 nm) change in the thickness of the lithium niobate piezoelectric plate. The thicknesses of the lithium niobate piezoelectric plate and the front-side $SiO_2$ layer can be combined to provide an equivalent thickness of the XBAR diaphragm as follows:

$$teqa=tp+ka(tfsd) \quad (1)$$

where teqa is the "LN-equivalent" thickness (i.e. the thickness of lithium niobate having the same resonance frequency) of the diaphragm for series resonators. tp and tfsd are the thickness of the piezoelectric plate and front-side dielectric layer as previously defined, and ka is proportionally constant for series resonators. ka depends on the material of the front-side dielectric layer. When the front-side dielectric layer is $SiO_2$, ka is approximately 0.45.

Figure 8:
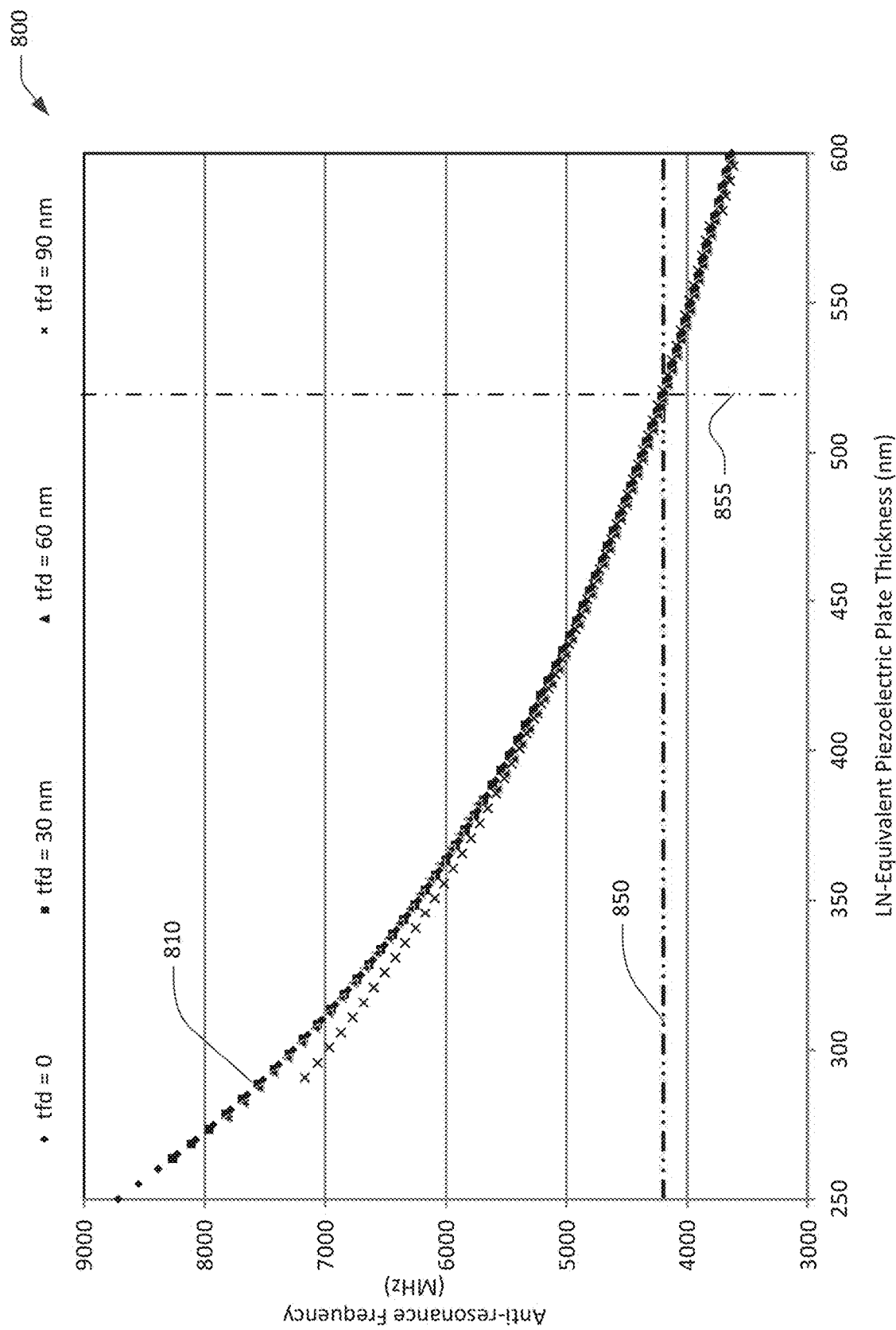
FIG. 8 is a graph of the anti-resonance frequency of an XBAR as a function of equivalent diaphragm thickness for four different dielectric thicknesses.

FIG. 8 is a graph 800 of the dependence of anti-resonance frequency on LN-equivalent diaphragm thickness. The data shown in FIG. 8 is the same as the data shown in FIG. 7, with LN-equivalent thickness calculated using formula (1) with ka=0.45. The composite line 810 is made up of the anti-resonance frequency data points for four different dielectric thicknesses. These data points form a reasonably continuous curve, with the exception of the combination of 90 nm front-side dielectric on relatively thin piezoelectric substrates.

The dash-dot-dot horizontal line 850 marks the upper edge of band N77 at 4200 MHz. The dash-dot vertical line 855 marks an LN-equivalent thickness of 518 nm, which is the thickness that provides a resonance frequency of 3300 MHz for an XBAR with pitch equal to 10 times the piezoelectric plate thickness. Reducing the pitch to 6 times the piezoelectric plate thickness increases anti-resonance frequency by about 3.2% compared to an XBAR with pitch equal to 10 times the piezoelectric plate thickness. Conversely, an XBAR with pitch equal to 6 times the piezoelectric plate thickness will need a 3.2% thicker diaphragm to have the same anti-resonance frequency as an XBAR with pitch equal to 10 times the piezoelectric plate thickness. Assuming IDT pitch is not less than 6 times the piezoelectric plate thickness, the maximum LN-equivalent thickness for series resonators of a band N77 is 518 nm×1.032 or about 535 nm.

In a band N77 filter using a ladder filter circuit, the diaphragms of all of the series resonators will have LN-equivalent thicknesses less than 535 nm. While there is no absolute minimum diaphragms thickness, at least one series resonator in a typical band N77 filter will have an LN-equivalent diaphragm thickness greater than 465 nm to provide an anti-resonance frequency less than or equal to 4500 MHz (300 MHz greater than the upper band edge).

The LN-equivalent thickness of the diaphragm of the series resonators need not be the same. One or more additional dielectric layer may be formed over a subset of the series resonators. The anti-resonance frequencies of series resonators without the additional dielectric layer will be further above the upper band edge (for example to increase attenuation in a stop band above the upper band edge).

Figure 9:
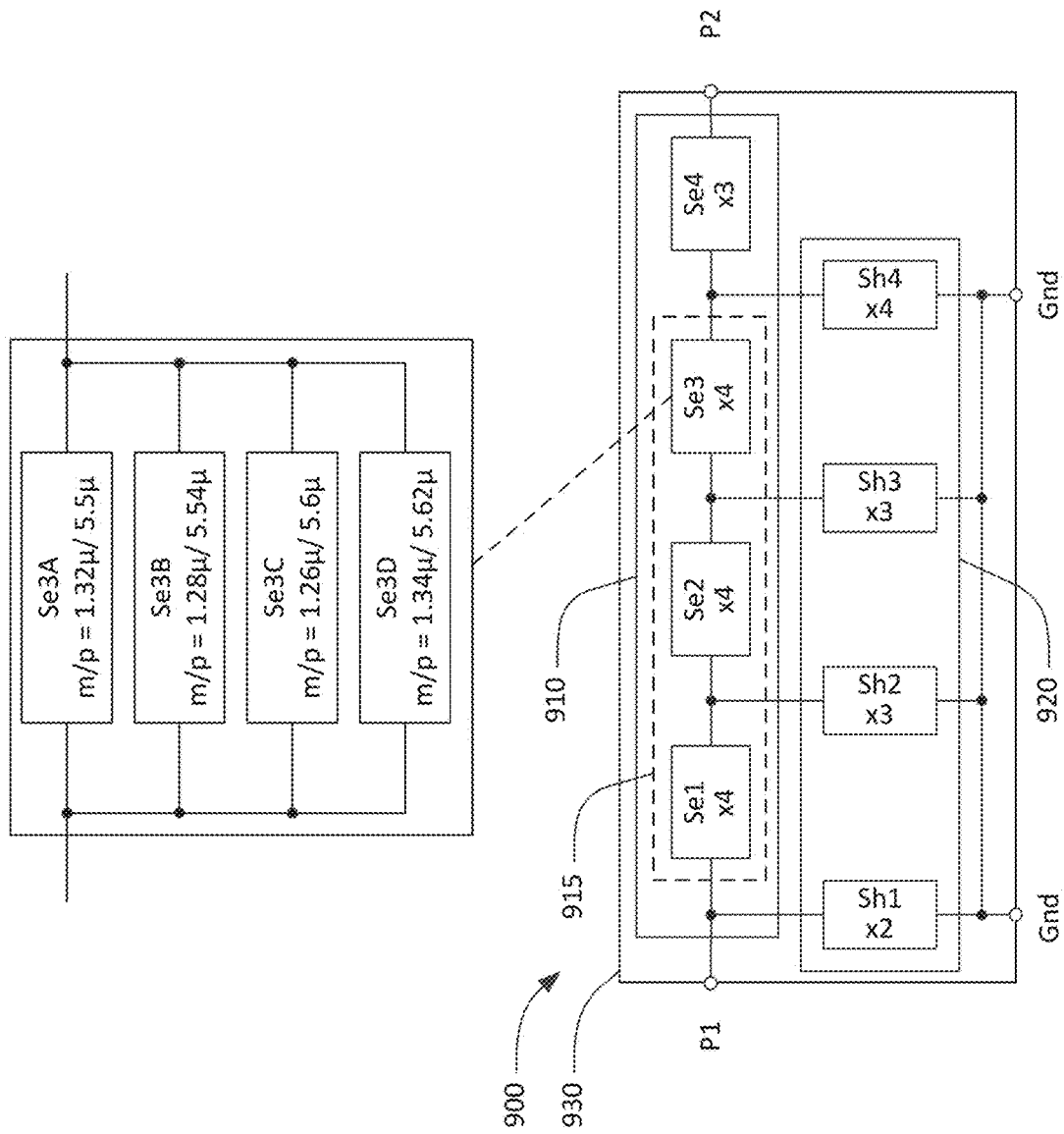
FIG. 9 is a schematic diagram of another exemplary split-ladder band N77 band-pass filter.

FIG. 9 is a schematic circuit diagram of an exemplary band N77 band-pass filter 900 using four series resonators Se1, Se2, Se3, Se4 and four shunt resonators Sh1, Sh2, Sh3, Sh4. The filter 900 has a conventional ladder filter architecture. The four series resonators Se1, Se2, Se3, Se4 are connected in series between a first port P1 and a second port P2. The filter 900 is bidirectional and either port may serve as the input or output of the filter. Shunt resonator Sh1 is connected from port P1 to ground. The other three shunt resonators Sh2, Sh3, Sh4, are connected from nodes between the series resonators to ground. All the shunt resonators and series resonators are composed of multiple XBAR sub-resonators connected in parallel. The number of sub-resonators is indicated below the reference designator (e.g. "×4") of each resonator. Dividing an XBAR into multiple sub-resonators has a primary benefit of reducing the peak stress that would occur if each XBAR had a single large diaphragm. The multiple sub-resonators of each resonator typically, but not necessarily, have the same aperture and approximately the same length.

The pitch and mark of the sub-resonators comprising any of the series or shunt resonators are not necessarily the same. As shown in the detailed schematic diagram, series resonator Se3 is composed of four sub-resonators Se3A, Se3B, Se3C, Se3D connected in parallel. Each of the sub-resonators Se3A-Se3D has a unique mark and pitch, which is to say the mark and pitch of any sub-resonator is different from the mark and pitch of each other sub-resonator. Co-pending application Ser. No. 17/039,239, Transversely-Excited Film Bulk Acoustic Resonator With Multi-Pitch Interdigital Transducer, describes the use of small variations (e.g. +1%) in pitch within the IDT of an XBAR to reduce the amplitude of spurious modes. The small variations in pitch shift the frequencies of spurious modes such that the spurious modes do not add constructively over the area of the XBAR. These small pitch variations have a negligible effect on the resonance and anti-resonance frequencies. The small changes in pitch between the sub-resonators Se3A, Se3B, Se3C, Se3D have a similar effect. The spurious modes of the sub-resonators do not add, resulting in lower overall spurious mode amplitude. This technique is used in three of the four series resonators and three of the four shunt resonators of the filter 900.

The filter 900 uses a "split-ladder" architecture in which the series resonators Se1-Se4 are fabricated on a first chip 910 and the shunt resonators Sh1-Sh4 are fabricated on a second chip 920. The first chip 910 and the second chip 920 are mounted on a circuit board 930 which provides interconnections between the first and second chips 910, 920. The first chip 910 and the second chip 920 include rotated y-cut piezoelectric plates with different thicknesses.

The first chip 910 includes a frequency setting dielectric layer 915 over the diaphragms of series resonators Se1-Se3, but not over the diaphragm of series resonator Se4. In other implementations of a Band N77 filter, both of the first chip 910 and the second chip 920 may include a frequency setting dielectric layer over the diaphragms of none, some, or all of the resonators on the chip.

Figure 10:
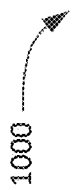
FIG. 10 is a table of resonator parameters for the exemplary band N77 band-pass filter of FIG. 8.

FIG. 10 is a table 1000 of parameters for the resonators of the filter 900 of FIG. 9. The piezoelectric plate of the first chip 910, which contains series resonators Se1-Se4, is 127.5-degree YX cut lithium niobate 455 nm thick. The IDT electrodes on the first chip 910 are substantially aluminum with a thickness of 670 nm. The first chip 910 has a 20 nm passivation dielectric layer and an additional 40 nm frequency setting dielectric layer over resonators Se1, Se2, and Se3.

The piezoelectric plate of the second chip 920, which contains shunt resonators Sh1-Sh4, is 127.5-degree YX cut lithium niobate 580 nm thick. The IDT electrodes on the second chip 920 are substantially aluminum with a thickness of 680 nm. The second chip 920 has a 20 nm passivation dielectric layer over all resonators.

The table 1000 includes the pitch, pitch/piezoelectric plate thickness ratio p/tp, mark, and mark/pitch ratio m/p for all resonators. Average values of pitch and mark are provided for resonators (such as resonator Se3 as shown in FIG. 9) where the pitch and/or mark is varied between sub-resonators. The p/tp ratio of all resonators falls within the preferred range of 6 to 12.5 as previously described. The m/p ratio of all resonators is with the preferred range of 0.2 to 0.3, as defined in co-pending application Ser. No. 17/030,066, TRANSVERSELY-EXCITED FILM BULK ACOUSTIC RESONATOR WITH REDUCED SPURIOUS MODES.

The filter 900 of FIG. 9 and FIG. 10 is exemplary. A band N77 bandpass filter may have more or fewer then four series resonators, more or fewer then four shunt resonators, and more or fewer than eight total resonators. A band N77 filter may incorporate additional components such as inductors or capacitors. Innumerable other filter designs using resonator parameters other than those given in FIG. 10 may be possible with the limitations that the LN-equivalent diaphragm thickness for shunt resonators is greater than or equal to 556 nm, and the LN-equivalent diaphragm thickness for series resonators is less than or equal to 535 nm.

Figure 11:
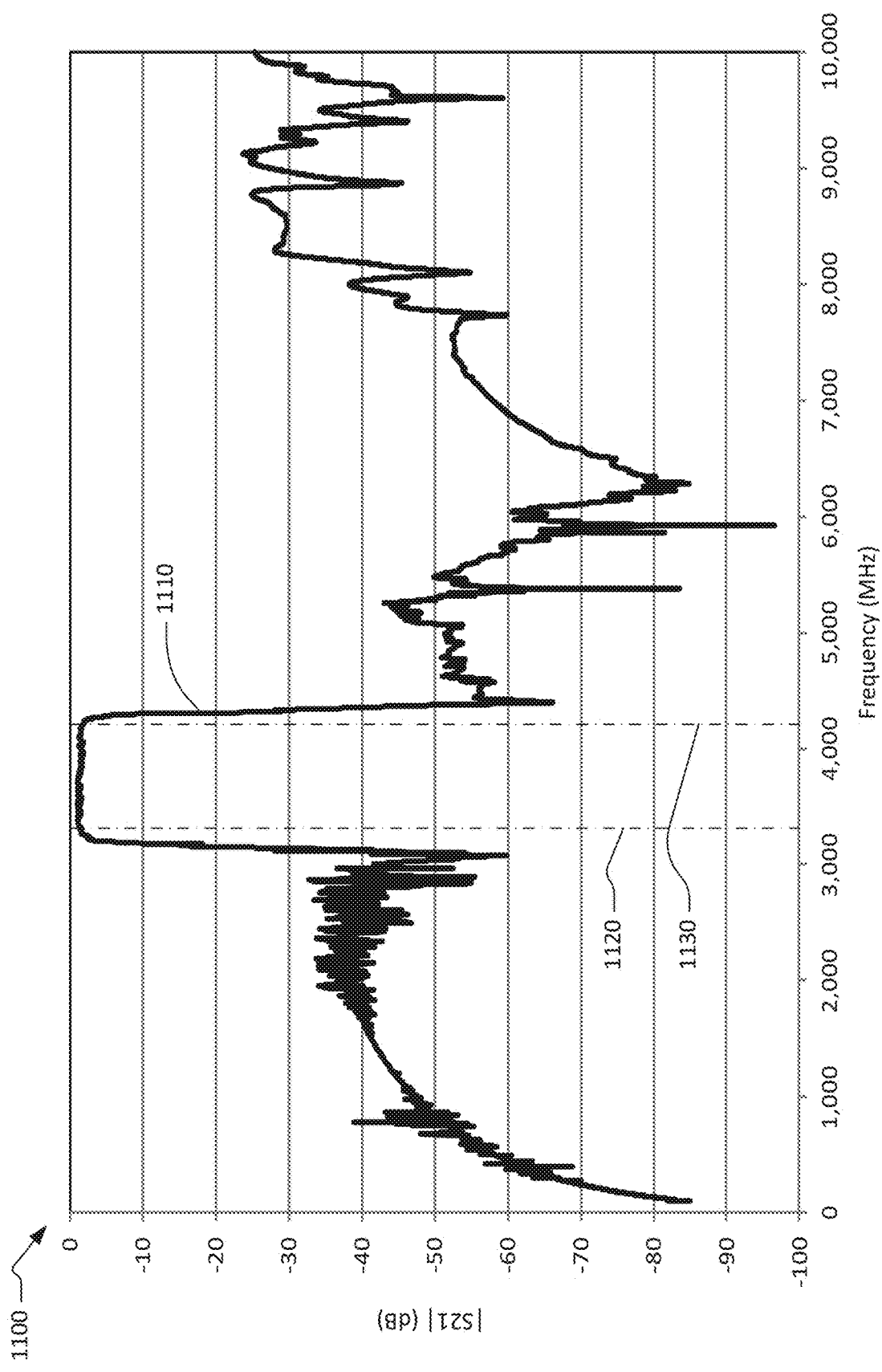
FIG. 11 is a graph of the magnitude of the input/output transfer function S21 for an exemplary spit-ladder band N77 band-pass filter.

FIG. 11 is a graph of the performance of an exemplary split ladder band N77 bandpass filter, which may be, or be similar to, the filter 900 of FIG. 9 and FIG. 10. Specifically, the curve 1110 is a plot of the magnitude of the input/output transfer function S21 of the exemplary filter over a frequency range from 100 MHZ to 10 GHz. The dot-dash lines 1120 and 1130 mark the lower and upper edge of band N77, respectively.

The resonators of a filter are connected to each other and to circuitry external to the filter by conductors. These conductors include, for example, metal patterns on the surface of the filter chip(s) and contacts, such as conductive balls and solder bumps, that connect the filter chip to the external circuitry. All of these conductors have small but finite inductance. While the inductance of conductors may be ignored at low frequencies, conductor inductance must be considered in the design of RF filters for communications devices.

Figure 12B:
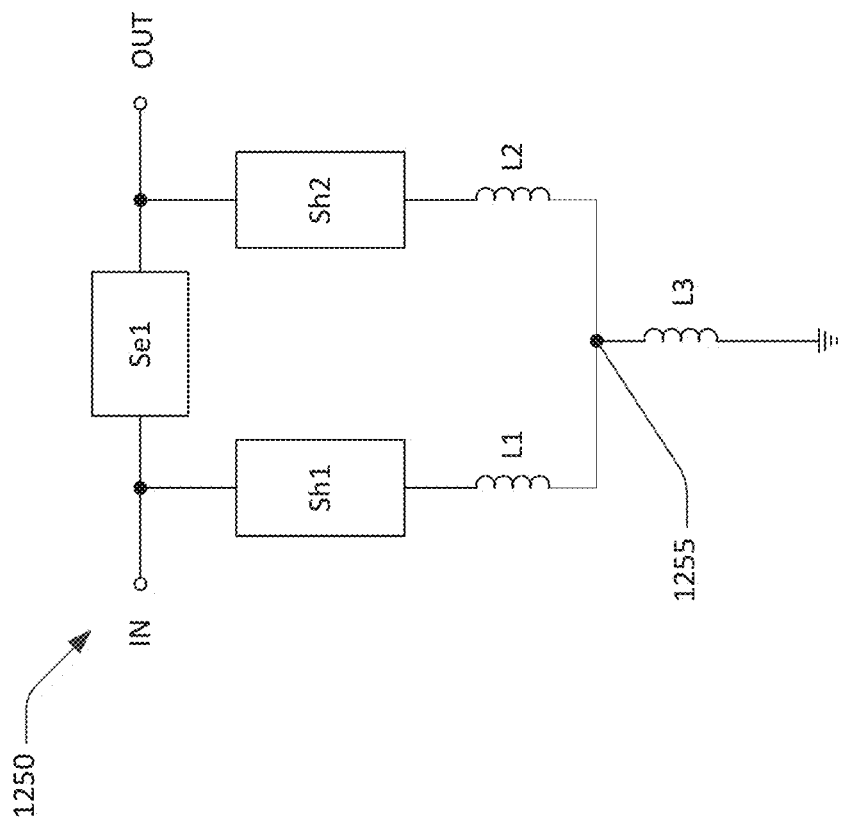
FIG. 12B is a schematic diagram of a ladder filter circuit with inductive cross-coupling.
Figure 12A:
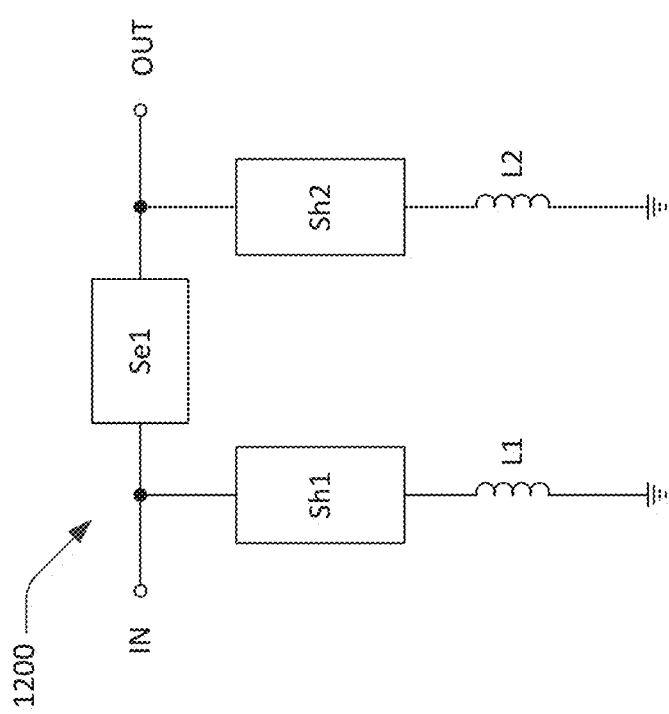
FIG. 12A is a schematic diagram of a ladder filter circuit.

FIG. 12A is a schematic diagram of a simple filter 1200 with two shunt resonators Sh1, Sh2 and a single series resonator Se1. The inductance of the conductor path from shunt resonator Sh1 to the system ground external to the filter is represented by lumped inductor L1. Similarly, the inductance of the conductor path from shunt resonator Sh2 to the system ground external to the filter is represented by lumped inductor L2. The presence of inductors L1 and L2 in series with the respective shunt resonators will cause a slight downward shift in the resonance frequencies of Sh1 and Sh2.

FIG. 12B is a schematic diagram of another simple filter 1250 with two shunt resonators Sh1, Sh2 and a single series resonator Se1. In the filter 1250, a portion of the conductor path from shunt resonator Sh1 to system ground is common with the conductor path from shunt resonator Sh2 to system ground. A common conductor path will be present, for example, if two or more shunt resonators are connected to the same contact pad on a chip. Lumped inductors L1 and L2 represent the portions of the conductor paths from Sh1 and Sh2, respectively, to system ground that are not common. The inductance of the common, or shared, conductor path from shunt resonators Sh1 and Sh2 to the system ground external to the filter is represented by lumped inductor L3. The presence of inductor L3 causes the node 1255 where the three inductors connect to be at an RF potential other than ground. The resonators Sh1 and Sh2 may be described as "inductively cross-coupled" since the potential at the node 1255 depends on the current flowing through both Sh1 and Sh2.

Inductive cross-coupling provides a signal path through Sh1, L1, L2, and Sh2 in parallel with the series resonator Se1. The amplitude and phase of RF current along this path is dependent on frequency and highly dependent on the value of the inductance L3. Inductive cross-coupling has been used in filters to cancel some of the signal flowing through shunt resonator Se1 to, for example, improve stopband attenuation.

Filters implemented with XBARs may divide series and shunt resonators into sub-resonators as shown, for example, in FIG. 9. The sub-resonators of a particular resonator have the same, or very nearly the same, resonance and anti-resonance frequencies. Sub-resonators of shunt resonators may be inductively-cross coupled in various combinations, which provides a filter designer with additional degrees of freedom to optimize filter parameters such as stop-band rejection.

Figure 13:
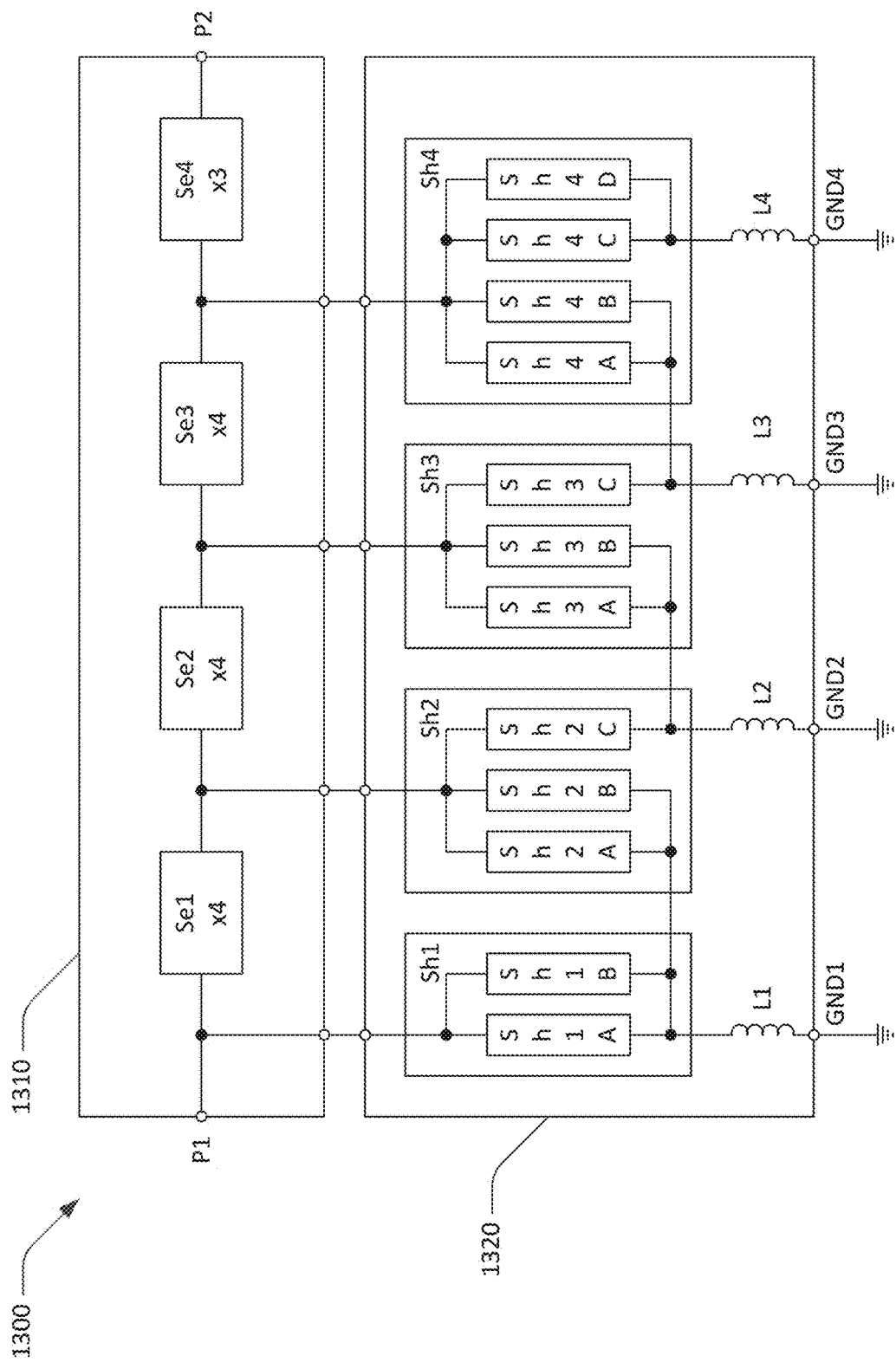
FIG. 13 is a schematic diagram of a split-ladder band filter using inductive cross-coupling.

FIG. 13 is a schematic circuit diagram of an exemplary band-pass filter 1300 with the same circuit configuration as the filter 900 of FIG. 9. The filter 1300 includes four series resonators Se1, Se2, Se3, Se4 and four shunt resonators Sh1, Sh2, Sh3, Sh4 in a conventional ladder filter architecture. The four series resonators Se1, Se2, Se3, Se4 are connected in series between a first port P1 and a second port P2. The filter 1300 is bidirectional and either port may serve as the input or output of the filter. Shunt resonator Sh1 is connected from port P1 to ground. The other three shunt resonators Sh2, Sh3, Sh4, are connected from nodes between the series resonators to ground. All the shunt resonators and series resonators are composed of multiple XBAR sub-resonators connected in parallel. The sub-resonators of series resonators Se1 to Se4 are not shown. The number of sub-resonators is indicated below the reference designator (e.g. "×4") of each resonator. The multiple sub-resonators of each resonator typically, but not necessarily, have the same aperture and approximately the same length. The pitch and mark of the sub-resonators comprising any of the series or shunt resonators are not necessarily the same as previously described.

The filter 1300 uses a "split-ladder" architecture in which the series resonators Se1-Se4 are fabricated on a first chip 1310 and the shunt resonators Sh1-Sh4 are fabricated on a second chip 1320. The first chip 1310 and the second chip 1320 are mounted on a circuit board (not shown) which provides interconnections between the first and second chips 1310, 1320.

The second chip 1320 containing shunt resonators Sh1-Sh4 has four ground contact pads labeled "GND1" to "GND4". Lumped inductors L1, L2, L3, and L4 represent the conductor paths through the respective ground contact pads to the system ground. While L1, L2, L3, and L4 are shown as parts of the second chip 1320, each inductor may include conductors on and off the second chip 1320. For example, each lumped inductor may include a conductor on the second chip, a conductive bump or ball connecting the second chip 1320 to the circuit board within the filter package, one or more conductors on the circuit board, and a conductive bump or ball connecting the package to a system ground plane.

The filter 1300 includes three instances of "partial inductive cross-coupling". Partial inductive cross-coupling occurs when at least one sub-resonator of a first shunt resonator and at least one, but not all, sub-resonators of a second shunt resonator share the same ground contact pad. In the filter 1300, both sub-resonators Sh1A, Sh1B of shunt resonator Sh1 and two (of three) sub-resonators Sh2A, Sh2B of shunt resonator Sh2 connect to system ground via lumped inductor L1 and contact pad GND1. The third sub-resonator Sh2C of shunt resonator Sh2 and two (of three) sub-resonators Sh3A, Sh3B of shunt resonator Sh3 connect to system ground via lumped inductor L2 and contact pad GND2. The third sub-resonator Sh3C of shunt resonator Sh3 and two (of four) sub-resonators Sh4A, Sh4B of shunt resonator Sh4 connect to system ground via lumped inductor L3 and contact pad GND3. The remaining sub-resonators Sh4C, Sh4D of shunt resonator Sh4 connect to system ground via lumped inductor L4 and contact pad GND4.

Figure 14:
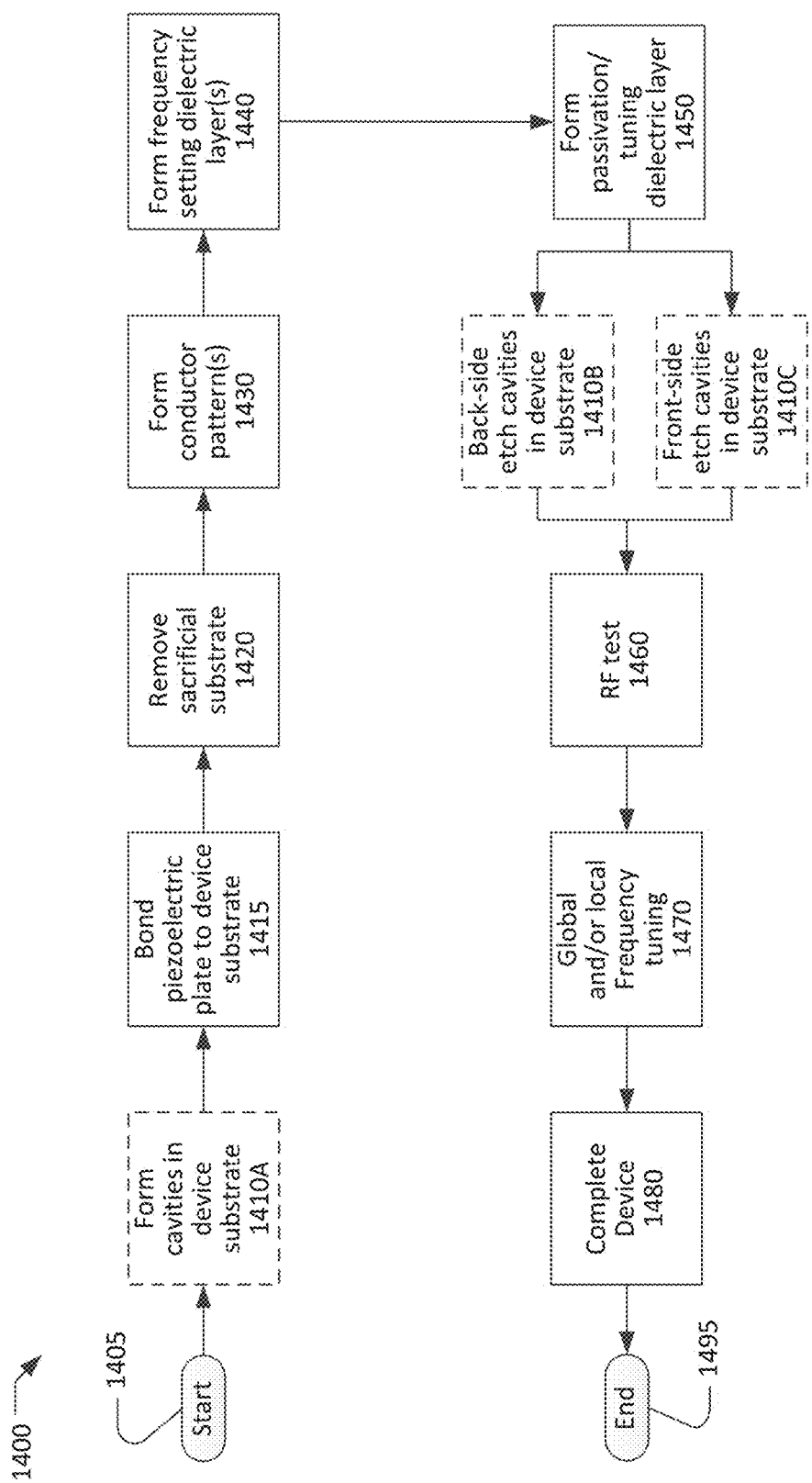
FIG. 14 is a flow chart of a process for fabricating a chip incorporating XBARs.

Although the filter 1300 has a "split ladder" architecture with separate chips 1310, 1320 for series and shunt resonator, partial inductive cross coupling may also be used in filters where both series and shunt resonators are formed on a single chip Description of Methods FIG. 14 is a simplified flow chart showing a process 1400 for making a wafer with a plurality of chips containing XBARs. The process 1400 starts at 1405 with a device substrate and a plate of piezoelectric material attached to a sacrificial substrate. The process 1400 ends at 1495 with a plurality of completed XBAR chips. The flow chart of FIG. 14 includes only major process steps. Various conventional process steps (e.g. surface preparation, cleaning, inspection, baking, annealing, monitoring, testing, etc.) may be performed before, between, after, and during the steps shown in FIG. 14. With the exception of step 1480, all of the actions are performed concurrently on all chips on the wafer.

The flow chart of FIG. 14 captures three variations of the process 1400 for making an XBAR which differ in when and how cavities are formed in the device substrate. The cavities may be formed at steps 1410A, 1410B, or 1410C. Only one of these steps is performed in each of the three variations of the process 1400.

The piezoelectric plate may be, for example, rotated YX-cut lithium niobate. The piezoelectric plate may be some other material and/or some other cut. The substrate may preferably be silicon. The substrate may be some other material that allows formation of deep cavities by etching or other processing.

In one variation of the process 1400, one or more cavities are formed in the device substrate at 1410A before the piezoelectric plate is bonded to the substrate at 1415. A separate cavity may be formed for each resonator on the chip. The one or more cavities may be formed using conventional photolithographic and etching techniques. Typically, the cavities formed at 1410A will not penetrate through the device substrate.

At 1415, the piezoelectric plate is bonded to the device substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

The sacrificial substrate may be removed at 1420, exposing a front surface of the piezoelectric plate. The actions at 1420 may include further processes, such as polishing and/or annealing, to prepare the exposed surface for subsequent process steps.

A conductor pattern, including IDTs of each XBAR, is formed at 1430 by depositing and patterning one or more conductor layers on the front surface of the piezoelectric plate. The conductor layer may be, for example, aluminum or an aluminum alloy with a thickness of 50 nm to 150 nm. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT busbars and interconnections between the IDTs).

The conductor pattern may be formed at 1430 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1430 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

One or more optional frequency setting dielectric layers may be formed at 1440 by depositing and patterning one or more dielectric layers on the front surface of the piezoelectric plate. The dielectric layer(s) may be formed between, and optionally over, the IDT fingers of some, but not all XBARs. The frequency setting dielectric layer(s) are typically $SiO_2$, but may be $Si_3N_4$, $Al_2O_3$, or some other dielectric material. The thickness of each frequency setting dielectric layer is determined by the desire frequency shift. In the example of FIG. 8 and FIG. 10, a frequency setting dielectric layer 40 nm thick is formed over the IDTs of XBARs SE1, SE2, and SE3.

A passivation/tuning dielectric layer is formed at 1450 by depositing a dielectric material over all of the front surface of the piezoelectric plate except pads used for electric connections to circuitry external to the chip. The passivation/tuning layer may be $SiO_2$, $Si_3N_4$, $Al_2O_3$, some other dielectric material, or a combination of two or more materials. The thickness of passivation/tuning layer is determined by the minimum amount of dielectric material required to deal the surface of the chip plus the amount of sacrificial material possibly needed for frequency tuning at 1470. In the example of FIG. 9 and FIG. 10, a passivation/tuning layer 20 nm thick (after tuning) is assumed over the IDTs of all XBARs.

In a second variation of the process 1400, one or more cavities are formed in the back side of the substrate at 1410B. A separate cavity may be formed for each resonator on the chip. The one or more cavities may be formed using an anisotropic or orientation-dependent dry or wet etch to open holes through the back side of the substrate to the piezoelectric plate.

In a third variation of the process 1400, one or more cavities in the form of recesses in the substrate may be formed at 1410C by etching the substrate using an etchant introduced through openings in the piezoelectric plate. A separate cavity may be formed for each resonator in a filter device. The one or more cavities formed at 1410C will not penetrate through the substrate.

In all variations of the process 1400, some or all of XBARs on each chip may be measured or tested at 1460. For example, the admittance of some or all XBARs may be measured at RF frequencies to determine the resonance and/or the anti-resonance frequencies. The measured frequencies may be compared to the intended frequencies and a map of frequency errors over the surface of the wafer may be prepared.

At 1470, the frequency of some or all XBARs may be tuned by selectively removing material from the surface of the passivation/tuning layer in accordance with the frequency error map developed at 1460. The selective material removal may be done, for example, using a scanning ion mill or other tool.

The chips may then be completed at 1480. Actions that may occur at 1480 include forming bonding pads or solder bumps or other means for making connection between the chips and external circuitry, additional testing, and excising individual chips from the wafer containing multiple chips. After the chips are completed, the process 1400 ends at 1495.

Figure 15:
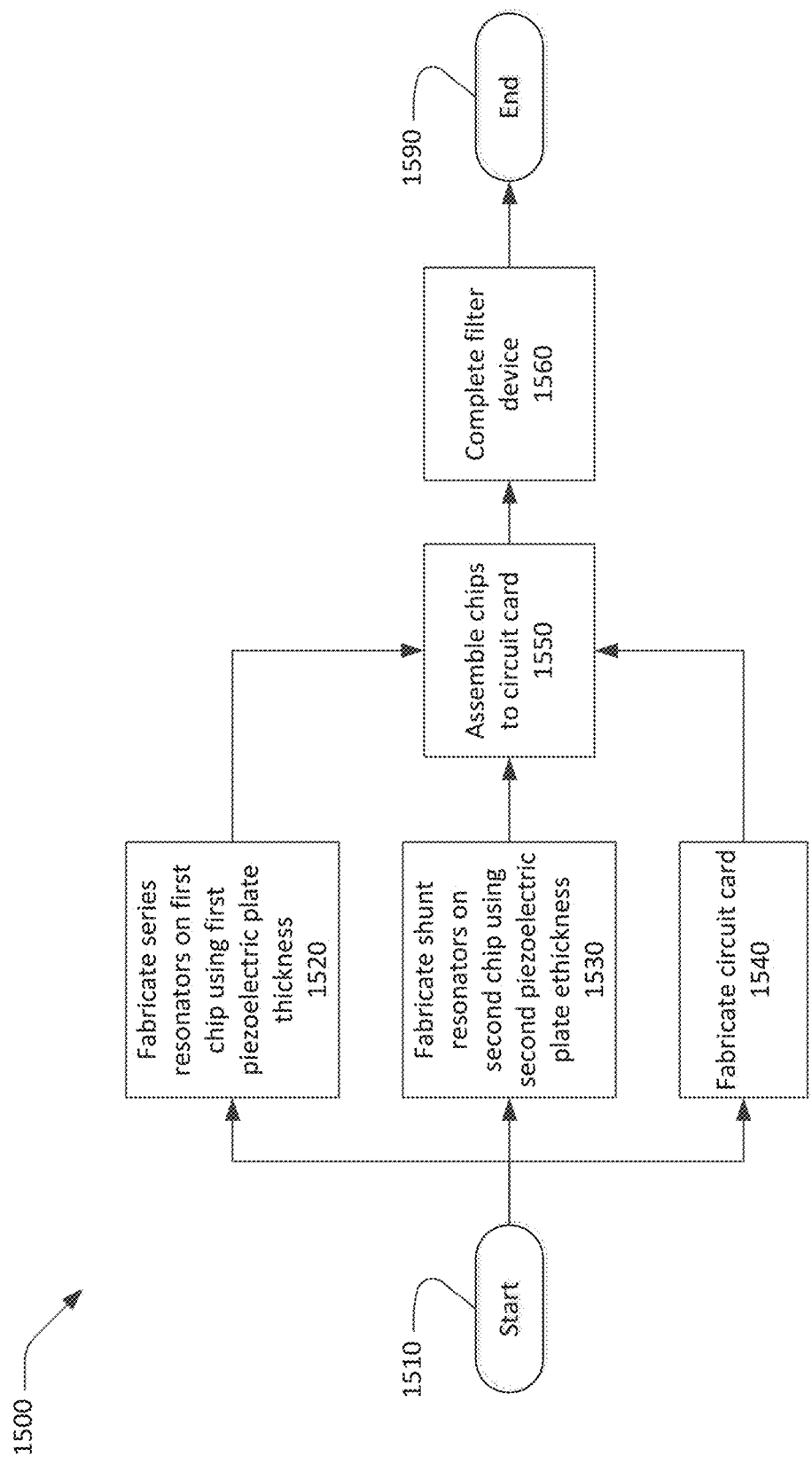
FIG. 15 is a flow chart of a process for fabricating a split-ladder filter.

FIG. 15 is a flow chart of a method 1500 for fabricating a split-ladder filter device, which may be the split ladder filter 900 of FIG. 9 or the filter 1300 of FIG. 13. The method 1500 starts at 1510 and concludes at 1590 with a completed filter device.

At 1520, a first chip is fabricated using the process of FIG. 14 with a first piezoelectric plate thickness. The first chip contains one, some, or all of the series resonators of the filter device. The first chip may be a portion of a first large multi-chip wafer such that multiple copies of the first chip are produced during each repetition of the step 1520. In this case, individual chips may be excised from the wafer and tested as part of the action at 1520.

At 1530, a second chip is fabricated using the process of FIG. 14 with a second piezoelectric plate thickness. The second chip contains one, some, or all of the shunt resonators of the filter device. The second chip may be a portion of a second large multi-chip wafer such that multiple copies of the second chip are produced during each repetition of the step 1530. In this case, individual chips may be excised from the wafer and tested as part of the action at 1530.

At 1540, a circuit card is fabricated. The circuit card may be, for example, a printed wiring board or an LTCC card or some other form of circuit card. The circuit card may include one or more conductors for making at least one electrical connection between a series resonator on the first chip and a shunt resonator on the second chip. The circuit may be a portion of large substrate such that multiple copies of the circuit card are produced during each repetition of the step 1540. In this case, individual circuit cards may be excised from the substrate and tested as part of the action at 1540. Alternatively, individual circuit cards may be excised from the substrate after chips have been attached to the circuit cards at 1550, or after the devices are packaged at 1560.

At 1550, individual first and second chips are assembled to a circuit card (which may or may not be a portion of a larger substrate) using known processes. For example, the first and second chips may be "flip-chip" mounted to the circuit card using solder or gold bumps or balls to make electrical, mechanical, and thermal connections between the chips and the circuit card. The first and second chips may be assembled to the circuit card in some other manner.

The filter device is completed at 1560. Completing the filter device at 1560 includes packaging and testing. Completing the filter device at 1560 may include excising individual circuit card/chip assemblies from a larger substrate before or after packaging.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A filter comprising:
a first shunt resonator comprising two or more first sub-resonators;
a second shunt resonator comprising two or more second sub-resonators;
at least one series resonator connected to the first and second shunt resonators in a ladder filter circuit; and
a first ground contact pad, wherein:
at least one of the two or more first sub-resonators and at least one, but less than all, of the two or more second sub-resonators are connected to the first ground contact pad.

2. The filter of claim 1, further comprising:
a second ground contact pad, wherein:
the two or more second sub-resonators not connected to the first ground contact pad are connected to the second ground contact pad.

3. The filter of claim 2, further comprising:
a third shunt resonator comprising two or more third sub-resonators, wherein;
at least one, but less than all, of the two or more third sub-resonators are connected to the second ground contact pad.

4. The filter of claim 2, wherein:
the second shunt resonator comprises three second sub-resonators, and
one second sub-resonator of the three second sub-resonators is connected to the first ground contact pad and two other second sub-resonators of the three second sub-resonators are connected to the second ground contact pad.

5. The filter of claim 2, wherein:
the second shunt resonator comprises four second sub-resonators, and
two second sub-resonators of the fours second sub-resonators are connected to the first ground contact pad and two other second sub-resonators of the fours second sub-resonators are connected to the second ground contact pad.

6. The filter of claim 1, wherein:
the at least one series resonator is on a first chip,
the first and second shunt resonators and the first ground contact pad are on a second chip.

7. The filter of claim 6, wherein;
the first chip and the second chip are mounted on a circuit card, and
the first chip, the second chip, and the circuit card collectively form the ladder filter circuit.

8. The filter of claim 1, wherein:
the first and second shunt resonators and the at least one series resonator are transversely-excited film bulk acoustic resonators (XBARs).

9. A filter comprising:
two or more series resonators connected in series between a first port and a second port;
at least first and second shunt resonators connected to the two or more series resonators in a ladder filter circuit; and
at least a first ground contact pad, wherein:
the first shunt resonator comprises two or more first sub-resonators,
the second shunt resonator comprises two or more second sub-resonators, and
at least one of the two or more first sub-resonators and at least one, but less than all, of the two or more second sub-resonators are connected to the first ground contact pad.

10. The filter of claim 9, further comprising:
a second ground contact pad, wherein:
the two or more second sub-resonators not connected to the first ground contact pad are connected to the second ground contact pad.

11. The filter of claim 10, further comprising:
a third shunt resonator comprising two or more third sub-resonators, wherein at least one, but less than all, of the two or more third sub-resonators are connected to the second ground contact pad.

12. The filter of claim 10, wherein:
the second shunt resonator comprises three second sub-resonators, and
one second sub-resonator of the three second sub-resonators is connected to the first ground contact pad and two other second sub-resonators of the three second sub-resonators are connected to the second ground contact pad.

13. The filter of claim 10, wherein:
the second shunt resonator comprises four second sub-resonators, and
two second sub-resonators of the four second sub-resonators are connected to the first ground contact pad and two other second sub-resonators of the four second sub-resonators are connected to the second ground contact pad.

14. The filter of claim 9, wherein;
the two or more series resonator are on a first chip,
the first and second shunt resonators and the first ground contact pad are on a second chip.

15. The filter of claim 14, wherein:
the first chip and the second chip are mounted on a circuit card, and
the first chip, the second chip, and the circuit card collectively form the ladder filter circuit.

16. The filter of claim 9, wherein:
the first and second shunt resonators and the two or more series resonators are transversely-excited film bulk acoustic resonators (XBARs).

* * * * *